(12) United States Patent
Inoue et al.

(10) Patent No.: US 7,653,114 B2
(45) Date of Patent: Jan. 26, 2010

(54) SEMICONDUCTOR LASER DIODE AND THE MANUFACTURING METHOD THEREOF

(75) Inventors: Yutaka Inoue, Komoro (JP); Yasuhisa Semba, Saku (JP); Susumu Sorimachi, Komoro (JP); Kouichi Kouzu, Komoro (JP)

(73) Assignee: Opnext Japan, Inc., Kanagawa (JP)

( * ) Notice: Subject to any disclaimer, the term of this patent is extended or adjusted under 35 U.S.C. 154(b) by 86 days.

(21) Appl. No.: 12/153,681

(22) Filed: May 22, 2008

(65) Prior Publication Data

US 2008/0291960 A1    Nov. 27, 2008

(30) Foreign Application Priority Data

May 25, 2007    (JP)    ............................... 2007-138621

(51) Int. Cl.
*H01S 5/00*    (2006.01)
*H01S 3/097*    (2006.01)
*H01L 21/00*    (2006.01)

(52) U.S. Cl. ..................... 372/87; 372/50.12; 438/34; 438/42

(58) Field of Classification Search ............. 372/43.01, 372/50.1, 50.12, 50.121, 87
See application file for complete search history.

(56) References Cited

FOREIGN PATENT DOCUMENTS

| JP | 2002-057401 | 8/2000 |
|----|-------------|--------|
| JP | 2005-217255 | 1/2004 |

*Primary Examiner*—Armando Rodriguez
(74) *Attorney, Agent, or Firm*—Stites & Harbison PLLC; Juan Carlos A. Marquez, Esq.

(57) ABSTRACT

A multibeam semiconductor laser diode having: an n-type semiconductor substrate; an n-type clad layer, an active layer, a p-type clad layer and a contact layer; a plurality of partitioning grooves extending from one end to the other end of the substrate and formed from the contact layer to a predetermined depth of the p-type clad layer; a stripe-shaped ridge sandwiched between two separation grooves; an insulating layer covering an area from each side wall of the contact layer of each ridge to an end of the partitioning region via the separation groove; a first electrode formed on a second plane of the substrate; and a second electrode formed in each partitioning region covering an area above the ridge, separation grooves and multilayer semiconductor layers outside the separation grooves, the second electrode being constituted of a lower second electrode layer and an upper second plated layer.

14 Claims, 19 Drawing Sheets

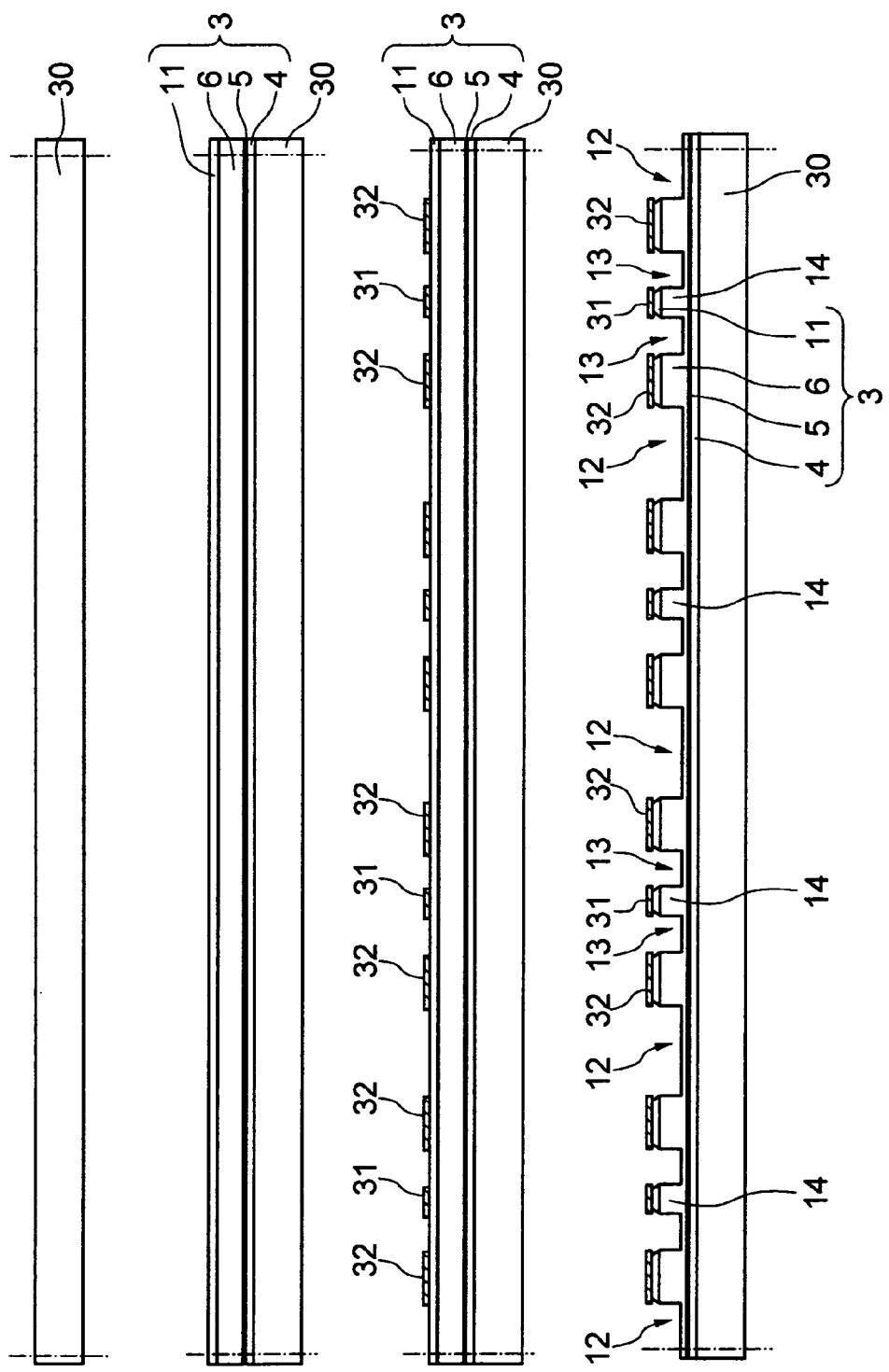

SEMICONDUCTOR LASER DIODE AND THE MANUFACTURING METHOD THEREOF

INCORPORATION BY REFERENCE

The present application claims priority from Japanese application JP2007-138621 filed on May 25, 2007, the content of which is hereby incorporated by reference into this application.

BACKGROUND OF THE INVENTION

The present invention relates to a semiconductor laser diode of a multibeam structure for emitting laser beams in parallel, its manufacture method and a manufacture method for an opto-semiconductor device. The present invention relates to technologies effective for being applied to manufacture technologies of e.g., a ridge structure semiconductor laser diode.

A semiconductor laser (laser diode: LD) is widely used as a light source of an optical communication system and an information processing apparatus. A visual light optical semiconductor laser is used for CD, DVD, a laser printer, POS, a bar code reader as well as a light source of an information processing apparatus such as a document file system.

A semiconductor laser diode (opto-semiconductor device) has a structure that a number of semiconductor layers (multilayer semiconductor layer) are epitaxially grown on a first surface of a semiconductor substrate. An active layer is disposed as a middle layer of the multilayer semiconductor layer. Of two layers sandwiching the active layer, one layer is a semiconductor layer of a first conductivity type and the other layer is a semiconductor layer of a second conductivity type to thereby form a pn junction. In order to form a resonator (optical waveguide) for laser oscillation, various structures have been adopted such as a narrow electrode and a ridge structure. Since the semiconductor laser diode has an anode electrode (p-electrode) and a cathode electrode (n-electrode), there is adopted a structure that the electrodes are disposed on the same plane side of the semiconductor laser diode or a structure that the electrodes are separately disposed on the front and rear surfaces of the semiconductor laser diode.

A semiconductor laser diode of a ridge structure has two separation grooves formed on the surface of a flat semiconductor layer in order to form a ridge (ridge stripe). Therefore, even in a state that an electrode is formed on the surface of the semiconductor laser diode, the separation grooves and steps of the concave and convex portions of the ridge appear on the surface correspondingly. As a result, if the electrode of the semiconductor laser diode is fixed in a so-called junction down state that the electrode plane is stacked upon a submount, with a soft bonding material such as solder being interposed therebetween, a void is likely to be generated between the submount and semiconductor laser diode due to the concave and convex portions. Although heat generated in the semiconductor laser diode is transferred to the submount via the bonding material, if the void is generated, it is difficult to efficiently transfer heat to the submount (e.g., refer to JP-A-2005-217255).

In the invention described in JP-A-2005-217255, the surface of a plated metal layer formed on the surface of a semiconductor laser diode is planarized to prevent a void from being generated.

A semiconductor laser diode of a so-called multibeam structure is known in which a plurality of resonators are disposed in parallel on a single semiconductor laser diode (also called a semiconductor laser chip) (e.g., refer to JP-A-2002-57401). JP-A-2002-57401 discloses a structure (2-beam structure) that two semiconductor laser diodes are mounted on one chip. The semiconductor laser disclosed in JP-A-2002-57401 has a buried hetero structure different from the ridge structure.

The semiconductor laser diode of the buried hetero structure is formed by using a substrate formed with a stripe-shaped mesa projection. The semiconductor laser has a semiconductor lamination body including a first clad layer of a first conductivity type, an active layer, a second clad layer of a second conductivity type, and a current block layer of the first conductivity type formed on mesa grooves on both sides of the mesa projection and contacting both side walls of the active layer over the whole thickness of the active layer. As an upper layer of the semiconductor lamination body, a first electrode of a structure including an alloying preventive film is formed, and a second electrode is formed on the bottom surface of the substrate. A step caused by a height of the mesa projection is formed on the surface of the semiconductor lamination body. The first electrode has a structure having two alloying preventive films and a stress relaxing layer formed between the two alloying preventive films and made of material softer than the two alloying preventive films.

The following problem occurs when mounting a semiconductor laser structure whose first electrode does not have a structure having two alloying preventive films and a stress relaxing layer formed between the two alloying preventive films and made of material softer than the two alloying preventive films.

Namely, for example, when the semiconductor laser is mounted from the first electrode side on a substrate such as a submount by using solder, a stress is applied from a bonding plane of the first electrode and solder to an operation region having a triangular cross sectional shape and constituted of the first clad layer, active layer and second clad layer respectively on the mesa projection. More in detail, a step is left on the surface of a semiconductor lamination body of the first electrode, corresponding to a height of the mesa projection formed on the semiconductor substrate, and a stress caused by a difference of a thermal expansion coefficient between the submount substrate and semiconductor laser is applied to the operation region so that the laser characteristics such as a polarization direction of a laser beam are influenced.

However, the semiconductor laser whose first electrode has two alloying preventive films can prevent alloying at the interface between the electrode and semiconductor lamination body or at the interface between the electrode and solder, in the area of the alloying preventive films. Further, by disposing the stress relaxing layer of Au or the like softer than the alloying preventive films at the position where alloying progress is to be prevented, it becomes possible to relax a stress to be caused by a difference of a thermal expansion coefficient between the substrate and semiconductor laser. As a result, even the structure that two semiconductor laser diodes are mounted on one chip, it is possible to prevent influence upon the laser characteristics such as a polarization direction of a laser beam.

A semiconductor laser diode of a multibeam structure is used as a light source of a plane paper copier (PPC) and a laser beam printer (LBP). A multibeam laser is required that each beam has uniform polarization characteristics. However, in practice, each beam has a variation in characteristics, and mitigating this variation is a technical issue inherent to a multibeam laser.

The variation mainly results from the following. (1) A size variation in a wafer process of manufacturing a semiconductor laser diode generates a variation in characteristics.

(2) A semiconductor laser device is made of compound semiconductor, and on the surface of the device, an insulating film such as an $SiO_2$ film and an electrode made of metal are formed. A stress (inner stress) is generated in the diode (chip) due to a difference of a thermal expansion coefficient between the insulating film and electrode, and this inner stress generates a variation in characteristics.

(3) A semiconductor laser diode is fixed to a submount (supporting base plate) made of aluminum nitride (AlN) and also fixed to a heat sink made of metal such as copper. A thermal stress is generated due to differences of linear thermal expansion coefficients of compound semiconductor, aluminum nitride (AlN) and the like, and metal and the like. This thermal stress generates a variation in characteristics.

The factors (2) and (3) in particular of generating a stress influence greatly the polarization characteristics. A variation in characteristics can be improved by relaxing the stress variation.

According to the comparative experiments made by the inventor, in a structure (so-called junction down mount) that a second electrode formed on a multilayer semiconductor layer including an active layer is stacked upon and bonded to a submount by using a soft bonding material such as solder, stresses particularly stresses near the mount plane of the semiconductor laser chip are dominant. A semiconductor laser diode of a ridge structure has a structure having a separation groove on both sides of a ridge, and two cavities corresponding to the separation grooves appear on the surface of the second electrode. Therefore, when the semiconductor laser is mounted on a submount (supporting base plate) by using a bonding material, it is difficult for the bonding material to reliably enter the cavities corresponding to the separation grooves, so that voids are generated at the interface between the second electrode plane and bonding material. It has been clarified that these voids apply stresses to an active layer region corresponding to the ridge, in other words, a resonator region, and a variation in polarization angles occurs. Namely, as voids are generated, uniformity (balance) of stresses applied to the ridge region from the submount and bonding material is broken, and rotation of a polarization angle occurs.

FIGS. 19A and 19B are schematic diagrams showing a state of mounting on a submount substrate a semiconductor laser diode of a ridge structure studied prior to the present invention. FIG. 19A is a diagram showing a state before the semiconductor laser diode is mounted on the submount, and FIG. 19B is a diagram showing a state after the semiconductor laser diode is mounted on the submount.

FIG. 19A shows a submount 70 and a semiconductor laser diode 75 to be mounted on a first plane 70a of the submount 70. The submount 70 is a flat plate body made of aluminum nitride (AlN) or the like, and an electrode pad 71 having a predetermined pattern is disposed on the first plane 70a. The electrode pad 71 is made of, e.g., an Au layer having a thickness of about 0.5 to 1.0 µm. A soft bonding material 72 is formed on the electrode pad 71. The bonding material 71 is made of, e.g., solder such as AuSn having a thickness of about 3 to 5 µm.

In order to mount the semiconductor laser diode 75 on the submount 70 in junction down, there is shown in FIGS. 19A and 19B a state that a first plane 76a of a semiconductor substrate 76 of a first conductivity constituting the semiconductor laser diode 75 is positioned at a lower plane, and that a second plane 76b as an opposite plane of the first plane 76a is positioned at an upper plane. On the first plane 76a of the semiconductor substrate 76, a multilayer semiconductor layer is formed by sequentially laminating a first conductivity type clad layer 77 of the first conductivity type, an active layer 78, a second conductivity type clad layer 79 of a second conductivity type and a contact layer 80 of the second conductivity type.

On the surface of the multilayer semiconductor layer, three or more partitioning groves 81 are formed extending from one end to the other of the semiconductor substrate 76 (e.g., from a front side to the back side of the drawing sheet) and from the surface of the contact layer 80 to a predetermined depth of the second conductivity type clad layer 79. In the drawing, two partitioning groove 81 are shown.

Two separation grooves 83 are formed in a central region of a partitioning region 82 sandwiched between the adjacent partitioning grooves 81. Similar to the partitioning groove 81, the separation groove 83 is formed extending from one end to the other of the semiconductor substrate 76 and from the surface of the contact layer 80 to the predetermined depth of the second conductivity type clad layer 79. A stripe-shaped convex region sandwiched between two separation grooves 83 is a ridge 84. Multilayer semiconductor layer regions outside the separation grooves 83, i.e., regions sandwiched between the separation grooves 83 and partitioning grooves 81 are called a field region 85.

On both sides of the ridge 84, an insulating layer 86 is formed covering the area from each side wall of the contact layer 80 of the ridge 84, via the separation groove 83 to the end of the partitioning region 82. A first electrode 91 is formed on the second plane 76b of the semiconductor substrate 76. The first electrode 91 is constituted of a first electrode layer 92 as an underlying layer and a first plating layer 93 formed on the first electrode layer 92.

On the side of the first plane 76a of the semiconductor substrate 76, a second electrode 95 is formed. The second electrode 95 is formed above the surface of the partitioning region 82, covering the areas above the ridge 84, above the separation groove 83 on both sides of the ridge 84, and above the field regions 85 (multilayer semiconductor layer regions outside the separation grooves 83). The second electrode 95 is constituted of a second electrode layer 96 as an underlying layer and a second plating layer 97 formed on the second electrode layer 96. The first and second electrode layers 92 and 96 are each a layer formed by sequentially laminating a Ti layer, a Pt layer and an Au layer by evaporation, and are each made of Au having a thickness of about 0.3 to 0.5 µm. The first and second plated layers 93 and 97 are each an Au layer having a thickness of about 3 to 5 µm formed by a plating process.

The semiconductor laser diode 75 shown in FIG. 19A is held by an unrepresented holding tool such as a collet, positioned above the submount 70, and lowered as indicated by an arrow to be stacked upon the submount 70. The semiconductor laser diode 75 is therefore mounted on (fixed to) the submount 70, as shown in FIG. 19B. During fixing, since the grooves are formed on the surface of the second electrode 95 in correspondence with the separation grooves 83, there is a high possibility that air remains in the grooves when the second electrode 95 is pushed against the bonding material 72, even if the melted bonding material 72 invades into the grooves. Remaining air forms an air bubble (void) 98. Since the semiconductor laser diode 75 generates heat during laser oscillation, a high temperature state of about 80° C. occurs. As the air bubble 98 is generated at the interface between the second electrode 95 and bonding material 72, uniformity (balance) of stresses applied to the ridge 84 having a narrow width of about 1 to 3 µmn is broken, resulting in rotation of a polarization angle. As shown in FIG. 19B, stresses indicated by arrows are applied, for example, to the center of the ridge 84 from both sides of the ridge 84, depending upon a difference of thermal expansion coefficients of various materials. In this case, in the region where the air bubble (void) 98 is generated, the air bubble region functions as a buffer, so that a stress indicated by an arrow directing from right to left is smaller than a stress indicated by an arrow directing from left to right. The arrow directing from right to left is shown shorter than the arrow directing from left to right, indicating a smaller stress. As uniformity (balance) of stress is broken, rotation of a polarization angle occurs.

FIG. 18 is a schematic diagram showing a polarization angle α. FIG. 18 is a plan view showing a state that a cap fixed to a first plane of a stem 100 is dismounted. A heat sink 101 having a rectangular solid shape is fixed to the central area of the first plane of the stem 100. A submount 70 is fixed to the side wall of the heat sink 101 on the center side of the stem 100. A laser beam 102 is indicated by a black circle and emitted from a facet (emission plane) of the semiconductor laser diode 75. A plane having arrows at opposite ends in FIG. 18 is a polarization plane 103, and an angle between the polarization plane 103 and a plane along an extension direction of an unrepresented active layer of the semiconductor laser diode 75 is the polarization angle α.

Even a semiconductor laser diode having a single resonator, if semiconductor laser diodes have a variation in polarization angles, the semiconductor laser diodes cannot be used, because desired characteristics cannot be obtained if an optical component has polarization angle dependency.

In the case of a semiconductor laser diode of a multibeam structure that the semiconductor laser diode has a plurality of resonators disposed in parallel, if there is a variation in polarization angles of laser beams emitted from respective resonators, the semiconductor laser diode cannot be used for an electronic apparatus such as a plain paper copier (PPC) and a laser beam printer using a semiconductor laser diode of the multibeam structure as its light source.

The semiconductor laser of JP-A-2005-217255 has a structure that the upper surface of the plated metal layer formed on the upper surface side of the ridge stripe region is planarized in order to prevent heat radiation from being lowered by generation of a void. However, if the structure of the flat upper surface of the plated metal layer has a structure that the flat plane of the plated metal layer is stacked upon the solder on the heat sink and the semiconductor laser is fixed by heating, melting and bonding, there is specifically no function of pushing air existing at the interface in the stacked state to the peripheral edges of the plated metal layer. Therefore, air may be left and an air bubble (void) is generated at the bonding interface. Further, although the surface of the plated metal layer is flat, if the surface of the solder is flat, the flat plane is stacked upon the flat plane so that an area not wetting the solder may be formed depending upon manufacture variation.

In a semiconductor laser diode of the multibeam structure that a plurality of resonators exist in parallel on the semiconductor laser diode, there are as many bonding regions by solder between the submount and electrode as the number of resonators so that a possibility of generating an air bubble (void) becomes high. A polarization angle of a laser beam emitted from the resonator having a generated air bubble becomes different from that of the other laser beams. This semiconductor laser diode cannot be used as a light source of an electronic apparatus having an optical component with polarization angle dependency.

SUMMARY OF THE INVENTION

An object of the present invention is to provide a semiconductor laser diode and the manufacture methods for the semiconductor laser diode and an opto-semiconductor laser diode, with a small variation in polarization angles and suitable for a light source of an electronic apparatus whose optical component has polarization angle dependency.

Another object of the present invention is to provide a semiconductor laser diode of a multibeam structure and the manufacture methods for the semiconductor laser diode and an opto-semiconductor laser diode, with a small variation in polarization angles and suitable for a light source of an electronic apparatus whose optical component has polarization angle dependency.

Another object of the present invention is to provide a manufacture method for an opto-semiconductor device using a semiconductor laser diode of a multibeam structure, with a small variation in polarization angles and suitable for a light source of an electronic apparatus whose optical component has polarization angle dependency.

The above and other objects and novel features of the present invention will become apparent from the description of the specification when read in conjunction with the accompanying drawings.

Brief description will be made in the following on the summary of typical inventions disclosed in this application.

(1) An opto-semiconductor device comprises:
a semiconductor laser diode having a semiconductor substrate of a first conductivity type, a multilayer semiconductor layer disposed on a first plane of the semiconductor substrate and having a plurality of resonators for laser oscillation, a first electrode formed on a second plane opposite to the first plane of the semiconductor substrate and supplying an electric power to each resonator, and a plurality of independent second electrodes formed on the multilayer semiconductor layer at predetermined positions and supplying an electric power to a predetermined one of the resonators; and
a supporting base plate having, at a first plane, electrode pads corresponding to the second electrodes of the semiconductor laser diode,
wherein:
each of the second electrodes of the semiconductor laser diode is stacked upon and bonded to each of the electrode pads of the supporting base plate, by a bonding material;
the semiconductor laser diode comprises:
the multilayer semiconductor layer constituted of a first conductivity type clad layer of the first conductivity type, an active layer of a multiple quantum well structure, a second conductivity type clad layer of a second conductivity type, and a contact layer of the second conductivity type sequentially stacked on the first plane of the semiconductor substrate;
a plurality of partitioning grooves formed in the multilayer semiconductor layer, extending from one end to the other end of the semiconductor substrate, and formed from a surface of the contact layer to a predetermined depth of the second conductivity type clad layer;
a stripe-shaped ridge formed in each partitioning region sandwiched between adjacent ones of the partitioning grooves, and sandwiched between two separation grooves extending from the one end to the other end of the semiconductor substrate and formed from the surface of the contact layer to the predetermined depth of the second conductivity type clad layer; and an insulating layer covering an area from each side wall of the contact layer of each of the ridges to an edge of the partitioning grooves via the separation groove, wherein:

the first electrode is disposed on the second plane of the semiconductor substrate;

the second electrode is formed in each of the partitioning regions, covering an area above the ridge, above the separation grooves on both sides of the ridge and above the multilayer semiconductor layers outside the separation grooves;

the second electrode is constituted of a lower second electrode layer and a second plated layer formed stacked upon the second electrode layer, the second plated layer having an arc cross section that a region corresponding a portion of the ridge is thickest and the second plated layer becomes gradually thin toward the partitioning grooves;

the semiconductor laser diode is fixed to the supporting base plate by temporary melting of the second plated layer; and the resonator is constituted of multiple layers including the active layer corresponding to the stripe-shaped ridge.

In the opto-semiconductor device:

the second conductivity type clad layer of the second conductivity type comprises a first second conductivity type clad layer, an etching stopper layer stacked upon the first second conductivity type clad layer, and a second second conductivity type clad layer stacked upon the etching stopper layer;

the etching stopper layer is made of material having a slower etching rate than an etching rate of the second second conductivity type clad layer;

bottoms of the partitioning grooves and the separation grooves are formed by the etching stopper layer; and the ridge is formed by the second second conductivity type clad layer and the contact layer.

The second electrode layer is a layer of a Ti layer, a Pt layer and an Au layer sequentially stacked, and the second plated layer is made of an Au layer.

The opto-semiconductor layer is manufactured by the following manufacture method.

The manufacture method for an opto-semiconductor device comprises steps of:

preparing a semiconductor laser diode comprising:

a semiconductor substrate of a first conductivity type;

a multilayer semiconductor layer constituted of a first conductivity type clad layer of the first conductivity type, an active layer, a second conductivity type clad layer of a second conductivity type, and a contact layer of the second conductivity type sequentially stacked on a first plane of the semiconductor substrate;

a plurality of partitioning grooves formed in the multilayer semiconductor layer, extending from one end to the other end of the semiconductor substrate, and formed from a surface of the contact layer to a predetermined depth of the second conductivity type clad layer;

a stripe-shaped ridge formed in each partitioning region sandwiched between adjacent ones of the partitioning grooves, and sandwiched between two separation grooves extending from the one end to the other end of the semiconductor substrate and formed from the surface of the contact layer to the predetermined depth of the second conductivity type clad layer;

an insulating layer covering an area from each side wall of the contact layer of each of the ridges to an edge of the partitioning groove via the separation groove;

a resonator formed in a potion of the active region corresponding to the ridge;

a first electrode formed on a second plane opposite to the first plane of the semiconductor substrate and supplying an electric power to each of the resonators; and a second electrode formed in each of the partitioning regions covering an area above the ridge, above the separation grooves on both sides of the ridge and above the multilayer semiconductor layers outside the separation grooves, wherein:

the second electrode is constituted of a lower second electrode layer and a second plated layer formed stacked upon the second electrode layer; and the second plated layer has an arc cross section that a region corresponding a portion of the ridge is thickest and the second plated layer becomes gradually thin toward the partitioning grooves;

preparing a supporting base plate on which the semiconductor laser diode is stacked and mounted at a first plane of the supporting base plate, the first plane having wirings including electrode pads corresponding to the second electrodes; and forming a soft conductive bonding material on the electrode pads of the base plate, thereafter abutting, pushing and bonding each of the second electrodes of the semiconductor laser diode to a corresponding one of the electrode pads, subjecting the bonding material to a hardening process to thereby mount the semiconductor laser diode on the supporting base plate.

In the semiconductor laser diode, a first conductivity type clad layer of the first conductivity type, an active layer, a first second conductivity type clad layer of the second conductivity type, an etching stopper layer of the second conductivity type, a second second conductivity type clad layer of the second conductivity type and a contact layer of the second conductivity type are sequentially stacked on the first plane of the semiconductor substrate, and the etching stopper layer is made of material having a slower etching rate than an etching rate of the second second conductivity type clad layer.

The active layer has a multiple quantum well structure.

The second electrode is formed by sequentially stacking a Ti layer, a Pt layer and an Au layer.

On the second electrode layer, an Au layer is formed by a plating process.

The semiconductor laser diode is manufactured by the following method.

The semiconductor laser diode is manufactured by a manufacture method comprising steps of:

(a) preparing a semiconductor substrate of a first conductivity type;

(b) forming a multilayer semiconductor layer by continuously and epitaxially growing a first conductivity type clad layer of the first conductivity type, an active layer, a second conductivity type clad layer of a second conductivity type, and a contact layer of the second conductivity type sequentially stacked on a first plane of the semiconductor substrate;

(c) forming a plurality of groove forming masks in parallel on the multilayer semiconductor layer by forming a cover film on the side of the first plane of the semiconductor substrate and selectively etching the cover film, the groove forming mask including a ridge forming etching mask for forming a stripe-shaped ridge and a field etching mask for forming a field on both sides of the ridge forming etching mask at positions spaced by a predetermined distance from the ridge forming etching mask;

(d) by using the groove forming masks as a mask, etching from a surface of the contact layer to a predetermined depth of the first conductivity type clad layer to form a partitioning groove on both sides of the groove forming mask, and in each partitioning region sandwiched between adjacent ones of the partitioning grooves, to form a separation groove between the ridge forming etching mask and the field etching mask, to thereby form a stripe-shaped ridge under the ridge forming etching mask;

(e) by forming an insulating layer on the side of the first plane of the semiconductor substrate and selectively etching the insulating film, forming an insulating layer covering an area from each side wall of the contact layer of each of the ridges to an edge of the partitioning groove via the separation groove;

(f) forming a second electrode in each of the partitioning regions covering an area above the ridge, above the separation grooves on both sides of the ridge and above the multilayer semiconductor layers outside the separation grooves;

(g) forming a first electrode on a second plane opposite to the first plane of the semiconductor substrate;

(h) cleaving the semiconductor substrate at a predetermined pitch along a direction perpendicular to a longitudinal direction of the ridge to form a plurality of stripe bodies; and (i) dividing the stripe body at and along portions of predetermined ones of the partitioning grooves to leave a plurality of the partitioning grooves, wherein the step (f) comprises steps of:

(j) forming a second electrode layer on a whole area of the first plane of the semiconductor substrate;

(k) by forming a photoresist film on the side of the first plane of the semiconductor substrate and electively etching the photoresist film, forming a photoresist film, in the partitioning region including the ridge, the separation groove on both sides of the ridge and the multilayer semiconductor layers adjacent to the separation grooves, having openings each opening an area from a predetermined position of one of the multilayer semiconductor layers to a predetermined position of the other of the multilayer semiconductor layers;

(l) forming a second plated layer by a plating process on the second electrode layer exposed in each of the openings;

(m) collectively polishing the photoresist film and the plated layer on the side of the first plane of the semiconductor substrate to planarize surfaces of the photoresist film and the plated layer, and thereafter removing the photoresist film; and (n) making the second plated layer having a planarized surface through collective polishing on the side of the first plane of the semiconductor substrate have an arc cross section a region corresponding a portion of the ridge is thickest and the second plated layer becomes gradually thin toward the partitioning grooves over the separation grooves, and the second electrode is constituted of the second electrode layer and the second plated layer stacked upon the second electrode layer.

The manufacture method further comprises after the step (n) a step (o) of removing the first electrode layer at least on each of the partitioning grooves.

In the step (b), a first conductivity type clad layer of the first conductivity type, an active layer, a first second conductivity type clad layer of the second conductivity type, an etching stopper layer of the second conductivity type, a second second conductivity clad layer of the second conductivity type, and a contact layer of the second conductivity type, are sequentially stacked on the first plane of the semiconductor substrate, and the etching stopper layer is made of material having an etching rate slower than an etching rate of the second second conductivity type clad layer.

In the step (b), the active layer is formed to have a multiple quantum well structure.

In the step (i) the second electrode layer is formed by sequentially stacking a Ti layer, a Pt layer and an Au layer.

In the step (k) an Au layer is formed by a plating process on the second electrode layer exposed in each of the openings.

Brief description will be made in the following on the advantages obtained by typical inventions disclosed in this application.

The opto-semiconductor device has a structure that the semiconductor laser diode having a plurality of semiconductor laser diode portions, disposed in parallel, for emitting laser beams is stacked upon and bonded to the submount via the soft bonding material (solder). The semiconductor laser diode has the first electrode as the common electrode on the first plane side of the semiconductor substrate, and the second electrodes inherent to the semiconductor laser diode portions on the second plane side. The electrode pads are disposed on the first plane side of the submount in correspondence with the second electrodes inherent to the semiconductor laser diode portions. Each second electrode is constituted of the lower second electrode layer and the upper second plated layer. The second plated layer has the arc cross section that the region corresponding to the ridge portion of each semiconductor laser diode portion is thickest, and the second plated layer is gradually thinned toward the partitioning grooves via the separation groove. Before the second electrode is stacked upon and fixed to the electrode pad of the submount, the soft bonding material (solder) is disposed on the electrode pad, and thereafter the semiconductor laser diode in a state that the second electrode faces downward is aligned in position and then lowered to make each second electrode be stacked upon being thrust into the bonding material on each electrode pad. The surface regions of the second plated layer on both sides of the center line gradually contact the bonding material, being thrust into the bonding material.

Air existing between the electrode pad and second plated layer is pushed out to both sides of the strip-shaped bonding region by the function of the arc cross section of the second plated layer. Air bubbles (voids) are not formed therefore at an interface between the bonding material and the second plated layer (second electrode). If the surface of the second plated layer is a flat surface, there may be generated an area where the flat surface bonding material does not become wet. However, there occurs no phenomenon that the bonding material does not become wet because of the second plated layer having the arc cross section.

Accordingly, a distribution of stress applied to the ridge portion to be caused by voids and wettability defects of the bonding material can be made uniform, an irregular stress will not be applied to the resonator (optical waveguide), and rotation of a polarization angle of a laser beam can be reduced. Since polarization angle rotation of a laser beam of the resonator can be reduced, a variation in polarization angle of each laser beam of the semiconductor laser diode of the multibeam structure becomes small, polarization angle of laser beams emitted from any resonators become coincident.

Other objects, features and advantages of the invention will become apparent from the following description of the embodiments of the invention taken in conjunction with the accompanying drawings.

BRIEF DESCRIPTION OF THE DRAWINGS

FIGS. 3A to 3D are schematic cross sectional views of a wafer illustrating processes from a wafer preparing process to a ridge forming process of a manufacture method for the semiconductor laser diode of the first embodiment.

FIG. 9 is a schematic diagram showing a plating vessel, the wafer and the like.

DESCRIPTION OF THE INVENTION

Embodiments of the present invention will be described in detail with reference to the accompanying drawings. In all drawings for explaining the embodiments of the invention, components having the same function are represented by identical reference symbols, and the duplicated description thereof is omitted.

First Embodiment

Figure 1:
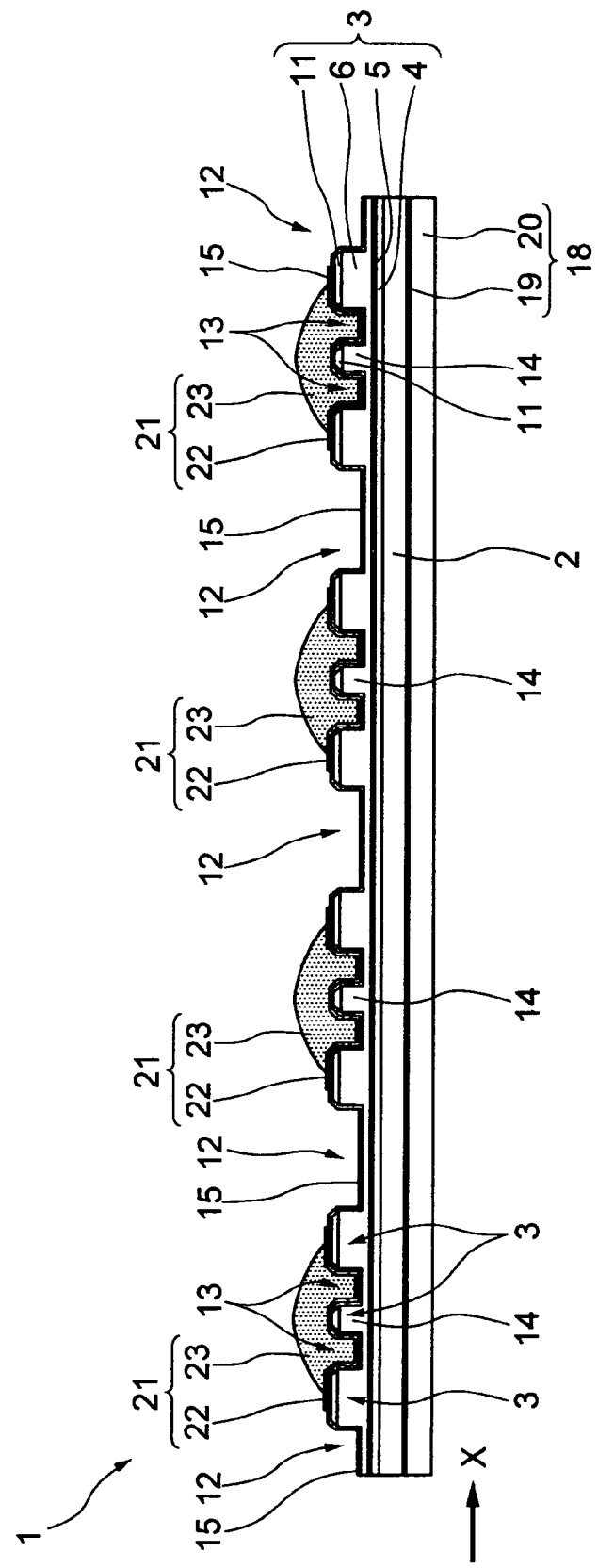
FIG. 1 is a cross sectional view of a semiconductor laser diode according to a first embodiment of the present invention.
Figure 2:
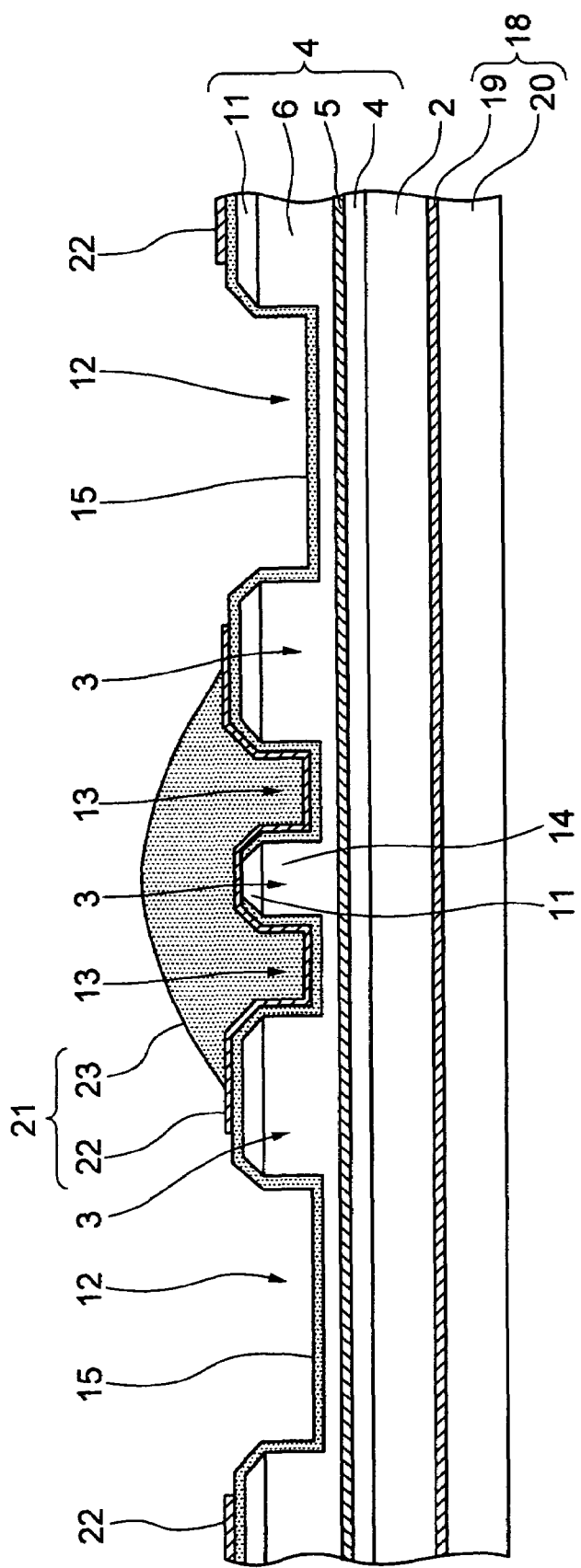
FIG. 2 is an enlarged cross sectional view showing a portion of FIG. 1.
Figure 8:
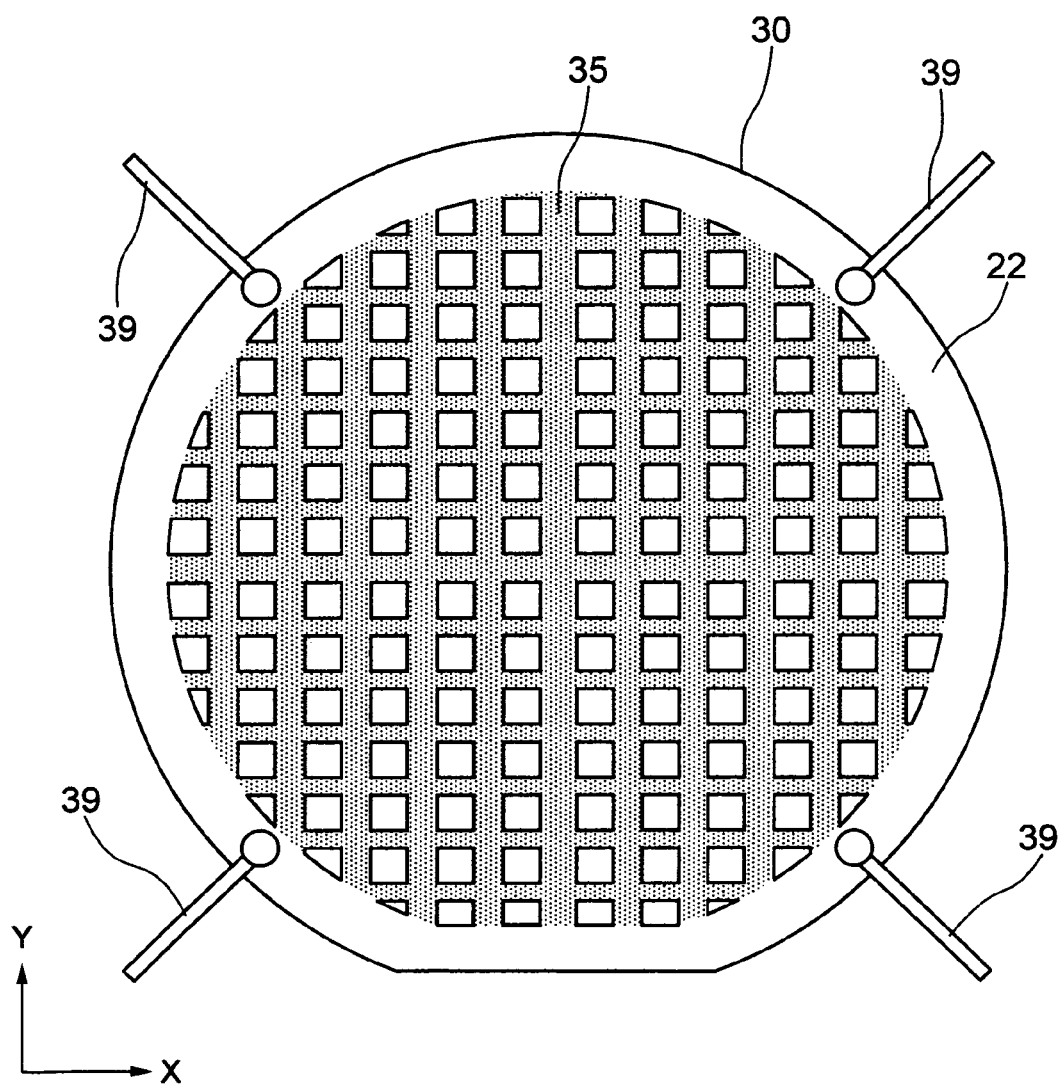
FIG. 8 is a schematic diagram showing a wafer with the second plated film formed thereon.
Figure 9:
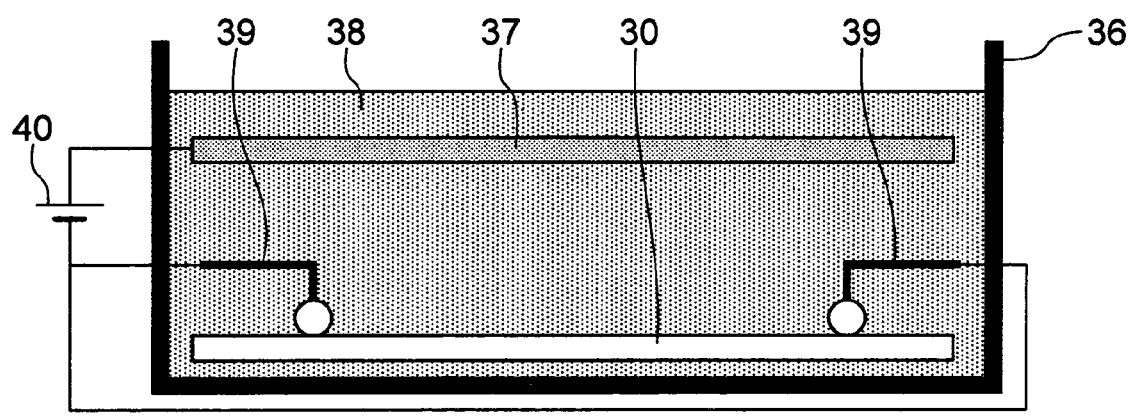
Figure 10:
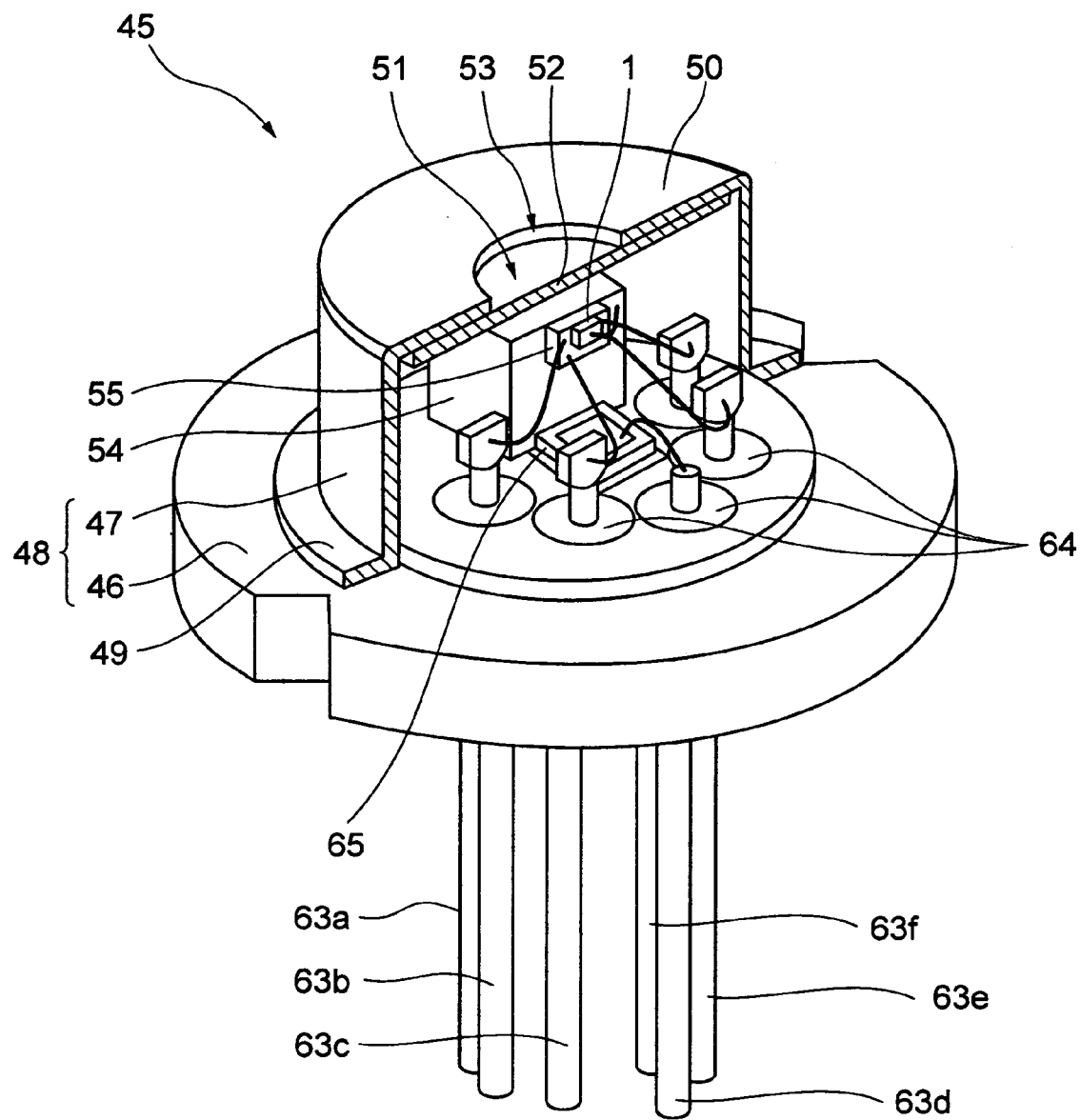
FIG. 10 is a partially broken perspective view of an opto-semiconductor device of the first embodiment of the present invention.
Figure 11:
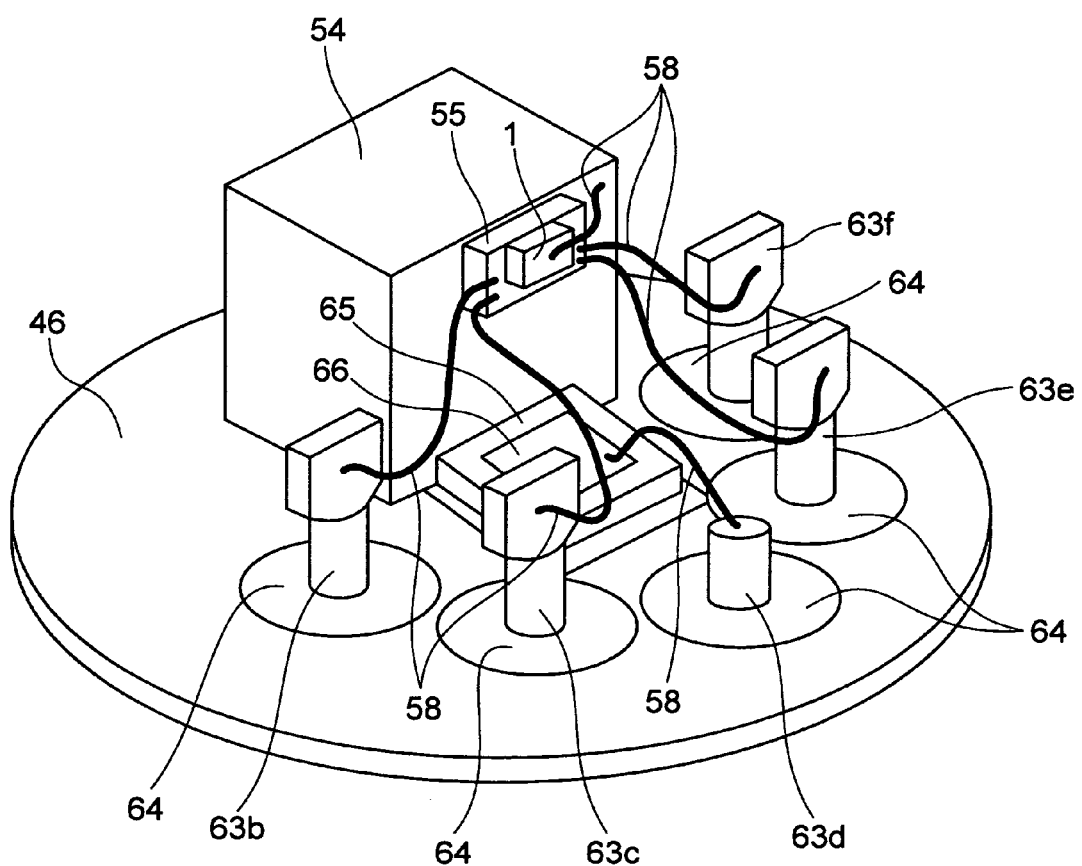
FIG. 11 is an enlarged perspective view showing a portion of FIG. 10.
Figure 12:
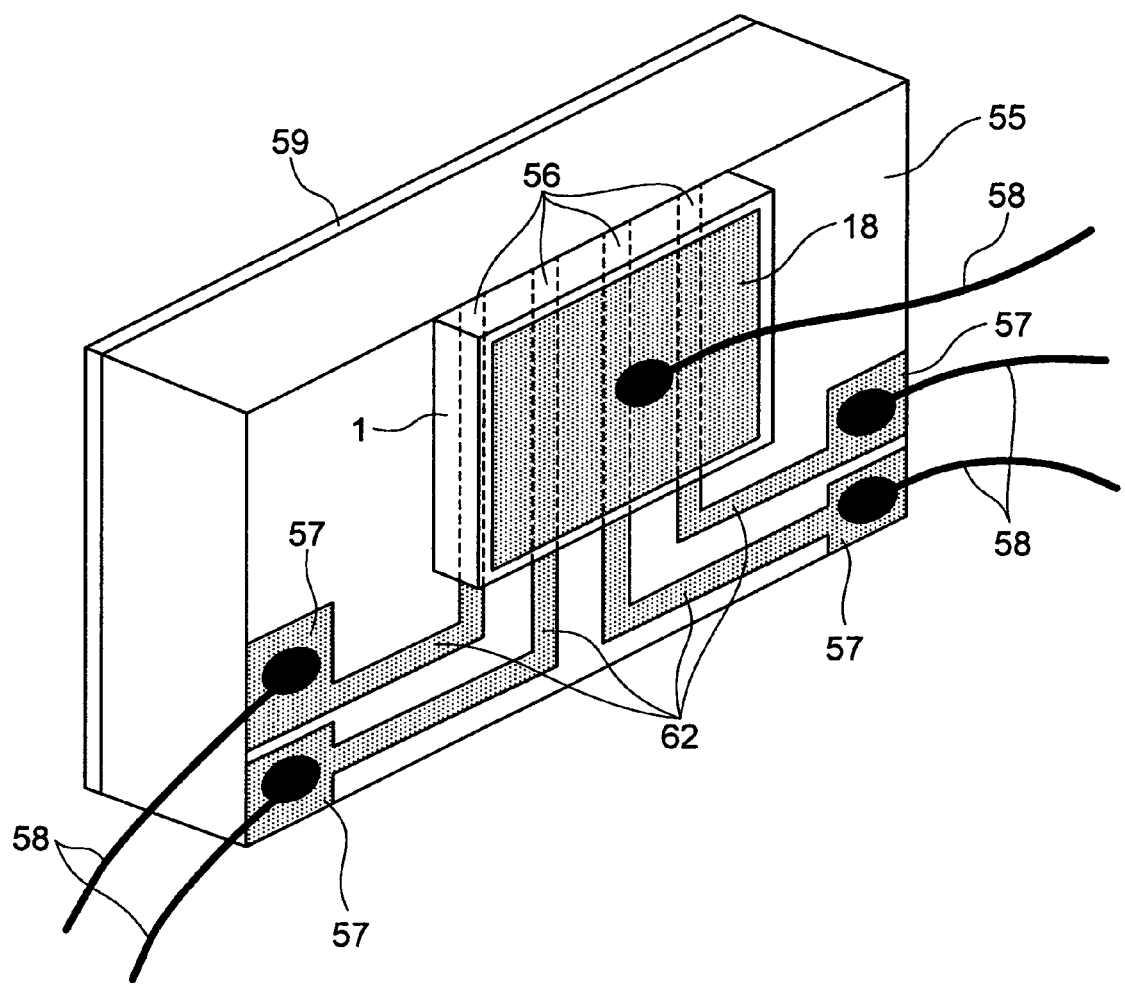
FIG. 12 is an enlarged perspective view showing a portion of FIG. 11.

FIGS. 1 to 16 are diagrams showing a semiconductor laser diode according to the first embodiment of the present invention and an opto-semiconductor device fabricating the semiconductor laser diode. FIGS. 1 and 2 are diagrams showing a semiconductor laser diode, and FIGS. 3A to 9 are diagrams illustrating a manufacture method for a semiconductor laser diode. FIGS. 10 to 12 are diagrams showing an opto-semiconductor device, and FIGS. 13A to 16 are diagrams illustrating a manufacture method for an opto-semiconductor device.

In the first embodiment, description will be made on a semiconductor laser diode of a ridge structure made of semiconductor of an n-type or a first conductivity type and a p-type or a second conductivity type and an opto-semiconductor device (semiconductor laser device). In the embodiment, description will be made on a multibeam semiconductor laser diode formed with a plurality of resonators by a plurality of ridges. In the embodiment, the multibeam laser diode will be described which has, for example, four resonators, a small variation in polarization angles of laser light (beams) emitted from each facet of the respective resonators, and uniform polarization angles of four laser beams.

A semiconductor laser diode 1 has the structure shown in FIGS. 1 and 2. FIG. 1 is a cross sectional view of the semiconductor laser diode 1, and FIG. 2 is an enlarged cross sectional view showing a portion of FIG. 1. As shown in FIGS. 1 and 2, the semiconductor laser diode (semiconductor laser chip) 1 has a semiconductor substrate 2 of a first conductivity type (n-type) and a multilayer semiconductor layer 3 formed on a first plane of the semiconductor substrate 2. The multilayer semiconductor layer 3 is constituted of a first conductivity type (n-type) clad layer 4 made of a semiconductor layer of the first conductivity type (n-type), an active layer 5, a second conductivity type (p-type) clad layer 6 made of a semiconductor layer of the second conductivity type (p-type), and a contact layer 11 made of a semiconductor layer of the second conductivity type (p-type).

Examples of material, thickness and the like of each semiconductor layer are as follows. The semiconductor substrate 2 is made of a GaAs substrate having a thickness slightly thinner than 100 μm. The n-type clad layer 4 is made of AlGaInP having a thickness of 1.5 μm. The active layer 5 has a multiple quantum well structure having a barrier layer made of a AlGaInP layer having a thickness of 5 nm, and three well layers each made of a GaInP layer having a thickness of 6 nm.

The p-type clad layer 6 is made of AlGaInP having a thickness of 1.5 µm. The contact layer 11 is made of a GaAs layer having a thickness of 0.4 µm.

Figure 7A:
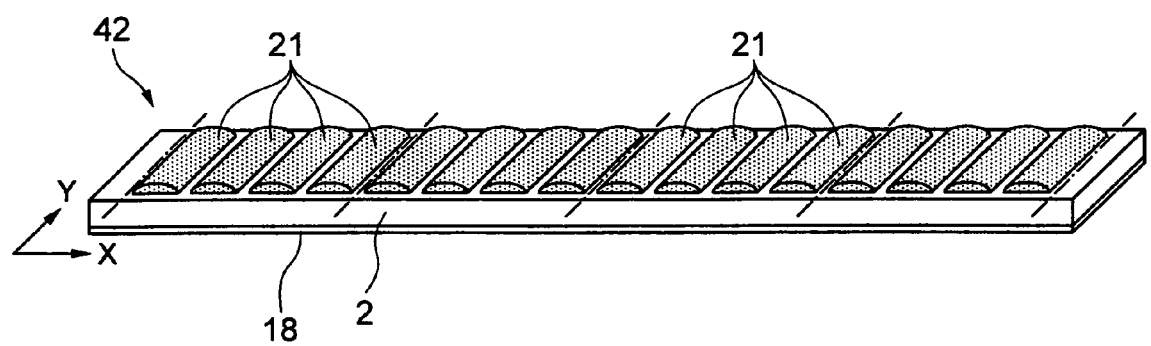
FIGS. 7A and 7B are schematic diagrams illustrating a process of cleaving the wafer at a predetermined pitch to form a plurality of stripe bodies and a process of dividing each stripe body to form semiconductor laser diodes, respectively of the manufacture method for the semiconductor laser diode of the first embodiment.
Figure 7B:
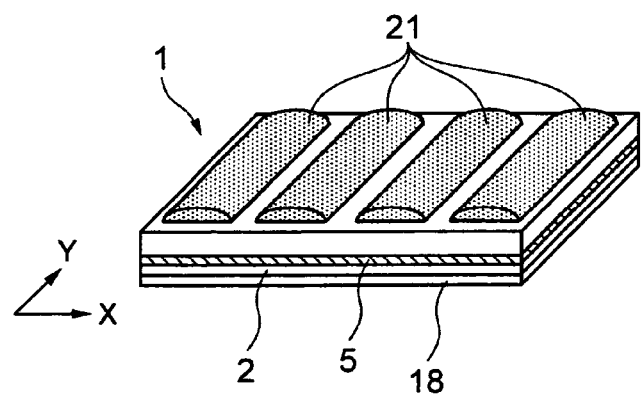

As shown in FIG. 7B, the semiconductor substrate 2 has a rectangle shape that as compared to a length along one direction (e.g., X direction), a length along the other direction (Y direction) crossing the one direction at a right angle is short. In the multilayer semiconductor layer 3, five partitioning grooves 12 are formed at a predetermined pitch in parallel along a direction from one end to the other of the semiconductor substrate 2 (in FIG. 1, for example, along a Y direction from the front side to the back side of the drawing sheet). This partitioning groove 12 extends from the surface of the multilayer semiconductor layer 3, i.e., from the surface of the contact layer 11, to the intermediate depth of the p-type clad layer 6. The partitioning grooves 12 are positioned at opposite end portions of the semiconductor substrate 1 along the longitudinal direction (X direction). Therefore, four partitioning regions are formed being sandwiched by adjacent partitioning grooves 12 and made of the multilayer semiconductor layer 3.

Two separation grooves 13 extending in parallel along the Y direction are formed in the multilayer semiconductor layer 3 in each partitioning region. This separation groove 13 extends from the surface of the multilayer semiconductor layer 3, i.e., from the surface of the contact layer 11, to the intermediate depth of the p-type clad layer 6. The stripe-shaped multilayer semiconductor layer 3 sandwiched between two separation grooves 13 is a ridge 14.

For example, a width of the ridge 14 is about 1 to 3 µm, a width of the separation groove 13 is about 10 to 20 µm, and a width of the partitioning groove 12 is about 10 to 20 µm. A pitch of the partitioning groove 12 is about 100 µm. A width of the partitioning groove 12 positioned at each of opposite ends is about a half of a width of the partitioning groove positioned inside. This is because the semiconductor wafer is cleaved along the X direction at a predetermined pitch at the final stage of manufacturing semiconductor laser diodes 1 to form a plurality of stripe bodies, and thereafter, the stripe body is divided along a center line of a predetermined partitioning groove 12 to leave four partitioning regions in parallel. Therefore, a size of the semiconductor laser diode 1 is, for example, 400 µm wide (length in the X direction), 300 to 1000 µm long (length in the Y direction) and about 100 µm high (thickness).

An insulating layer 15 is disposed covering an area from each side wall of the contact layer 11 of each ridge 14, via the separation groove 13, to the end of the partitioning groove 12. The insulating layers 15 are integrated in each partitioning groove 12 in a coupled state. As a result, only a partial surface of the contact layer 11 is exposed in the insulating layer 15. For example, the insulating layer 15 is made of $SiO_2$ having a thickness of 400 µm.

A first electrode (n-electrode) 18 is disposed on a second plane opposite to the first plane of the semiconductor substrate 2. The first electrode 18 is constituted of a lower first electrode layer 19 made of Ti/Pt/Au and an upper first plated layer 20 made of Au. For example, a thickness of the first electrode layer 19 is 0.3 to 0.5 µm, and a thickness of the first plated layer 20 is about 3 to 5 µm.

In each partitioning region, a second electrode 21 is disposed in an area above the ridge 14, above the separation grooves 13 on both sides of the ridge 14, and above the multilayer semiconductor layers 3 outside the separation grooves 13. The second electrode 21 is constituted of a lower second electrode layer 22 made of Ti/Pt/Au and an upper second plated layer 23 made of Au. One of the features of the present invention is that the second plated layer 23 is thickest in the region corresponding to the ridge 14, and gradually thinned toward the partitioning grooves 12 to form an arc cross section. For example, a width of the second electrode 22 is 0.3 to 0.5 µm, and a thickness of the second plated layer 23 at the thickest position is about 3 to 5 µm.

As a predetermined voltage is applied across the first electrode 18 and second electrode 21 of the semiconductor laser diode 1 having the above-described structure, the active region 5 corresponding to each stripe-shaped ridge 14 becomes a stripe-shaped resonator, and a laser beam is emitted from opposite facets of the resonator. Since the semiconductor laser diode 1 has a structure that four ridges 14 are disposed in parallel, four resonators are formed and four laser light (beams) are emitted from front and back emission planes which are opposite facets of the semiconductor laser diode 1.

If a region (field region) including the ridge 14 between adjacent separation grooves 13, the separation grooves 13 on both sides of the ridge 14 and the multilayer semiconductor layers 3 is defined as a semiconductor laser diode portion for emitting a single laser beam, the semiconductor laser diode 1 of the first embodiment has a structure that four semiconductor laser diode portions are disposed in parallel.

Next, with reference to FIG. 3A to FIG. 9, description will be made on a manufacture method for the semiconductor laser diode 1. First, as shown in FIG. 3A, a first conductivity type (n-type) semiconductor wafer 30 (semiconductor substrate) is prepared which is made of GaAs having a thickness of 450 µm and has a first plane and a second plane opposite to the first plane.

The wafer 30 has the first plane for forming the multilayer semiconductor layer 3, the first plane having a crystal plane inclined by about θ relative to the GaAs crystal plane (001). The first plane of the semiconductor substrate 2 has the <001> direction. An extension direction of the resonator of the semiconductor laser diode 1 is the crystal direction <110>. Two one-dot chain lines shown in FIG. 3A indicate positions at which the wafer 30 is divided. Therefore, the semiconductor laser diode forming region is between two one-dot chain lines. A length between two one-dot chain lines is 400 µm for example. A direction from one-dot chain line to one-dot chain line is the X direction of the wafer 30, and a direction perpendicular to the X direction is the Y direction. The wafer 30 is eventually thinned and divided vertically and horizontally (cleaved in the X direction and divided in the Y direction) to form a plurality of semiconductor laser diodes 1.

Next, as shown in FIG. 3B, an n-type clad layer 4, an active layer 5 of a multiple quantum well structure, a p-type clad layer 6 and a p-type contact layer 11 are formed by one metal organic chemical vapor deposition (MOCVD) process of an MOCVD method. On the first plane of the wafer 30, the multilayer semiconductor layer 3 is therefore formed including the n-type clad layer 4, active layer 5, p-type clad layer 6 and contact layer 11. For example, the n-type clad layer 4 is made of AlGaInP having a thickness of 1.5 µm. The active layer 5 has a multiple quantum well structure having an n-type clad layer made of an AlGaInP layer having a thickness of 5 nm and three well layers made of a GaInP layer each having a thickness of 6 nm. The p type clad layer 6 is made of AlGaInP having a thickness of 1.5 µm. The contact layer 11 is made of GaAs having a thickness of 0.4 µm.

Next, as shown in FIG. 3C, an insulating film is formed on the upper surface of the contact layer 11 by CVD, and formed in a predetermined pattern by commonly used photolithography techniques and etching techniques to form a groove forming mask. For example, the insulating film is made of an $SiO_2$ film having a thickness of 400 nm. The groove forming mask is constituted of a stripe-shaped ridge forming etching mask 31 for forming the ridge 14 and a stripe-shaped field etching mask 32 formed at a position spaced apart from the ridge forming etching mask 31. The stripe is formed in the Y direction of the wafer 30 by a predetermined length.

As shown in FIG. 3C, four groove forming masks are disposed in parallel in the semiconductor laser diode forming region between two one-dot chain lines, each groove forming mask being constituted of a set of one ridge forming etching mask 31 and a pair of field etching masks 32 on both sides of the ridge forming etching mask 31.

Next, etching is performed by using as a mask the groove forming mask (ridge forming etching mask 31 and field etching mask 32), to form grooves extending from the surface of the contact layer 11 and reaching the intermediate depth of the lower p-type clad layer 6. As shown in FIG. 3D, the grooves include the separation grooves 13 between the ridge forming etching mask 31 and field etching mask 32, and the partitioning grooves 12 between the field etching masks 32, i.e., between the groove forming masks. A ridge 14 is formed under the ridge forming etching mask 31, and a field region is formed under the field etching mask 32.

For example, a width of the ridge 14 is 1 to 3 µm, a width of the separation groove 13 is 10 to 20 µm, and a width of the partitioning groove 12 is 10 to 20 µm.

Figure 4A:
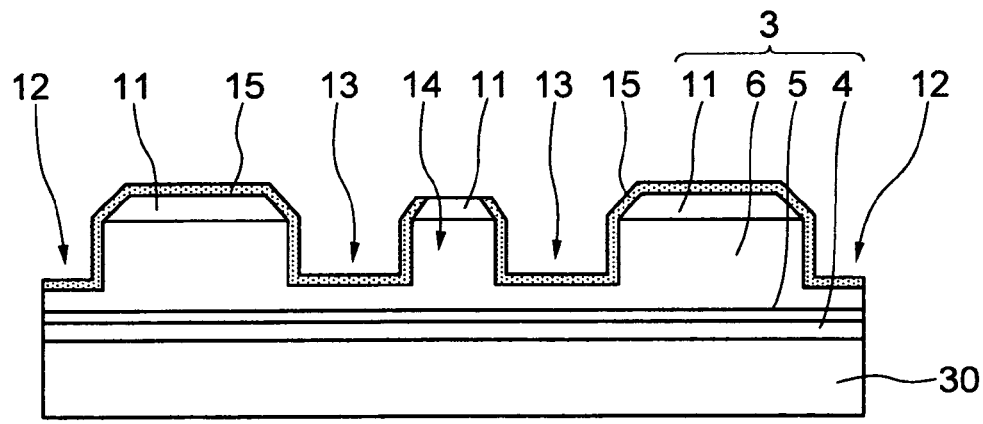
FIGS. 4A to 4C are schematic cross sectional views of the wafer illustrating processes from an insulating film forming process to a photoresist film forming process for forming a second plated film, respectively of the manufacture method for the semiconductor laser diode of the first embodiment.
Figure 4B:
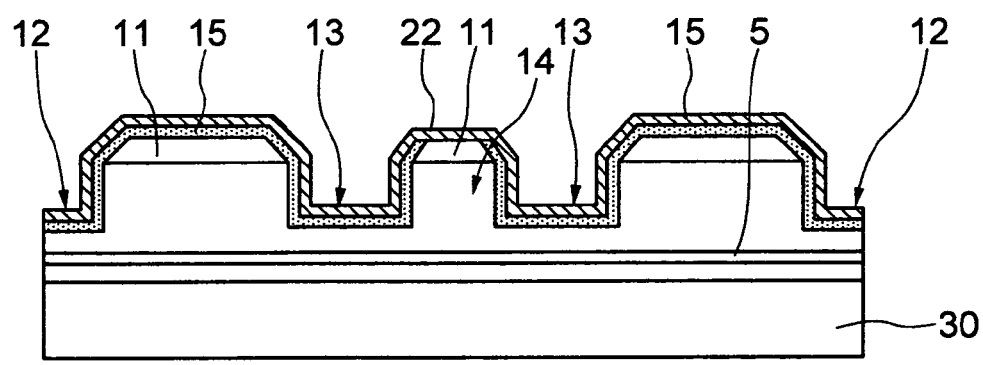

Next, an insulating layer is formed on the first plane side of the wafer 30 and selectively etched to form an insulating layer 15 covering the area from each side wall of the contact layer 11 of each ridge, via the separation groove 13, to the separation groove 12, as shown in FIG. 4A. Description will be made with reference to FIGS. 4A to 4C showing a single semiconductor laser diode portion.

Figure 4C:
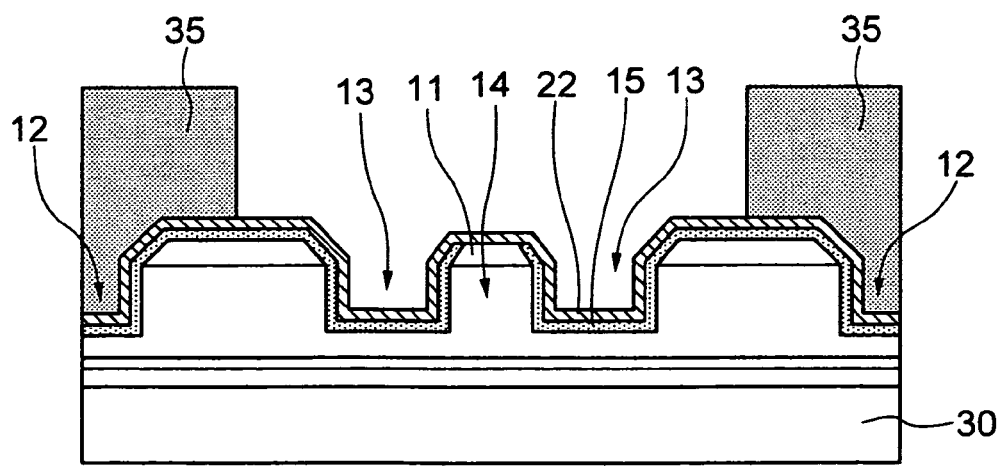

Next, as shown in FIG. 4C, a second electrode layer 22 is formed on the whole surface on the first plane side of the wafer 30. For example, the second electrode layer 22 is made of Ti/Pt/Au. The uppermost layer is the Au layer. For example, a thickness of the second electrode layer 22 is about 0.3 to 0.5 µm.

Next, a second plated layer 23 is selectively formed on the second electrode layer 22. In forming the second plated layer 23, as shown in FIGS. 4C and 8, a mask 35 is selectively formed above the first plane of the wafer 30. The mask 35 is formed by forming a photoresist film on the first plane side of the wafer 30 and selectively etching the photoresist film. Namely, the mask 35, formed for the partitioning region constituted of the ridge 14, separation grooves 13 on both sides of the ridge 14, and multilayer semiconductor layers 3 adjacent to the separation grooves 13, has the photoresist film opening a region from a predetermined position of one multilayer semiconductor layer 3 to a predetermined position of the other multilayer semiconductor layer 3. As indicated in FIG. 8 by a dotted area, the mask 35 is formed in a lattice shape in an area excluding the peripheral area of the wafer 30.

Figure 5A:
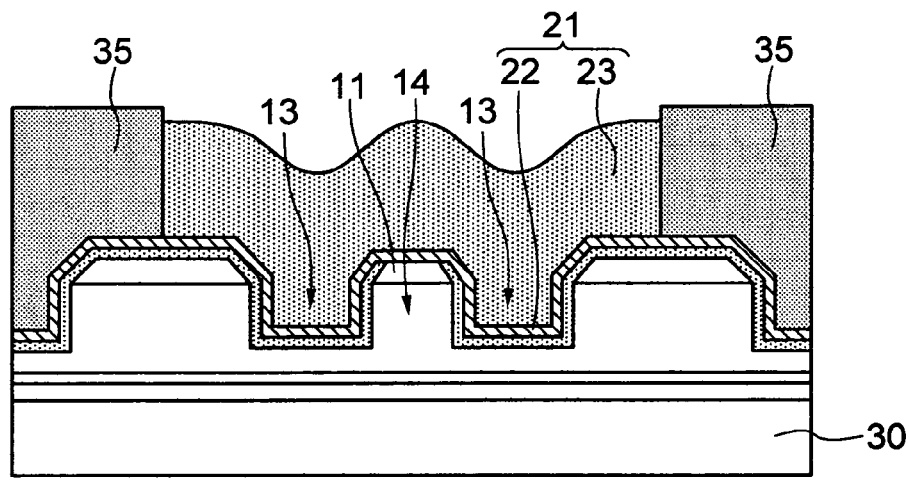
FIGS. 5A to 5C are schematic cross sectional views of the wafer illustrating a second plated film forming process, a second plated film planarizing process, and a process of removing the photoresist film, respectively of the manufacture method for the semiconductor laser diode of the first embodiment.

Next, the second plated layer 23 having a predetermined thickness is formed on the second electrode layer 22 exposed in each opening, by a plating process. For example, as shown in FIG. 5A, the second plated layer 23 made of Au having a thickness of about 3 to 5 µm is formed on the second electrode layer 22 formed above the first plane of the wafer 30, by electrolytic plating. In the electrolytic plating process, as shown in FIG. 9 the wafer 30 is placed on the inner bottom of a plating vessel 36, thereafter, an electrolytic plating anode plate 37 is disposed facing the wafer 30, and plating liquid 38 is accommodated in the plating vessel 36. The wafer 30 and electrolytic plating anode plate 37 are immersed in the plating liquid 38. As shown in FIG. 8, electric field plating power feeding pins 39 to be connected to a cathode electrode are mounted on the second electrode layer 22 above the first plane of the wafer 30. A plurality of electric field plating power feeding pins 39 are disposed so as to apply a voltage uniformly to the second electrode layer 22. As shown in FIG. 9, a power source 4 applies a predetermined voltage across the electric field plating anode plate 37 and wafer 30. The electric plating anode plate 37 is connected to the anode of the power supply 40, and the second electrode layer 22 (not shown) of the wafer 30 is connected to the cathode of the power supply 40. In this state, the plating is performed for a predetermined time so that as shown in FIG. 5A, the second plating layer 23 is formed on the second electrode layer 22 exposed outside the mask 35. In this manner, the second electrode (p-electrode) is formed being constituted of the second electrode layer 22 and second plated layer 23. The second plated layer 23 is formed with a concave and convex surface by reflecting the concave and convex surface of the ridge 14 and separation grooves 13. Considering a succeeding planarizing process, the second plated layer 23 is formed as thick as about 10 µm.

Figure 5B:
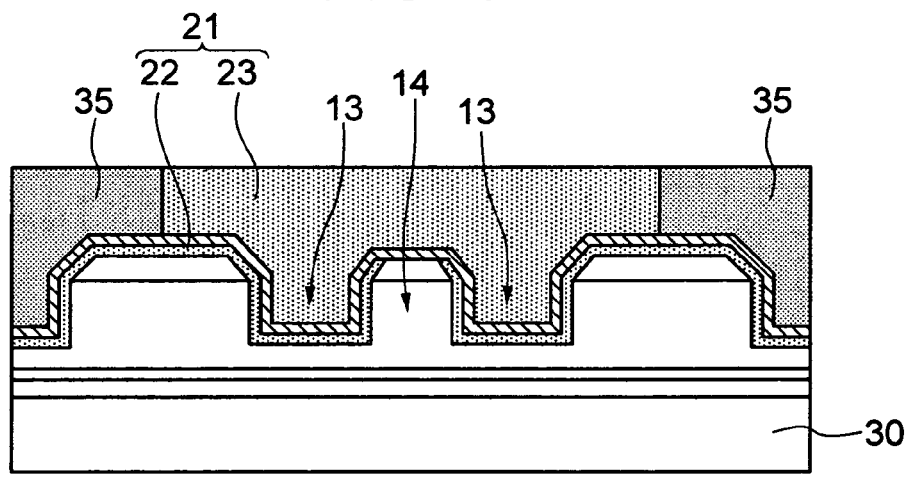
Figure 5C:
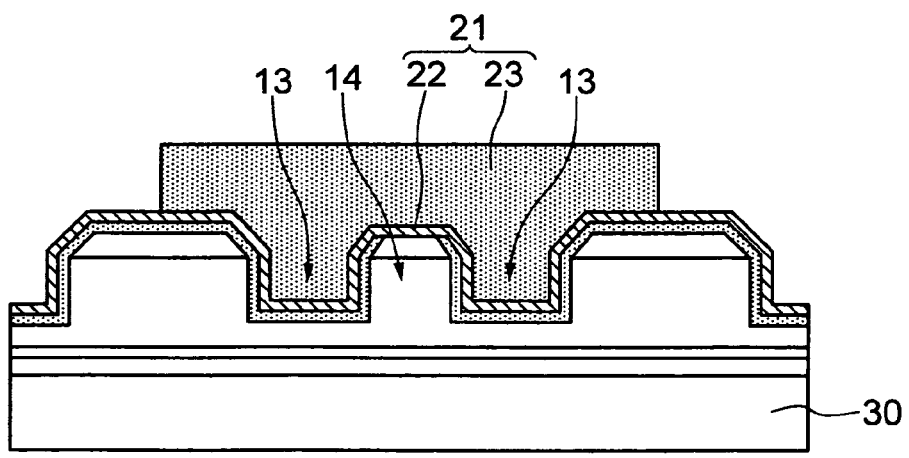

Next, the mask 35 and second plated layer 23 on the first plane side of the wafer 30 are polished collectively to obtain a flat surface, and the mask 35 is thereafter removed. Namely, as shown in FIG. 5B, the first plane side of the wafer 30 is polished to make the surfaces of the mask 35 and second plated layer 23 be flush with each other. In this planarizing process, considering a succeeding polishing process of forming the second plated layer 23 in an arc cross section, a thickness of the second plated layer 23 above the surface of the ridge 14 is set to about 5 to 7 µm. Polishing is CMP polishing for example. Thereafter, as shown in FIG. 5C, the mask 35 is removed by etching.

Next, the second plated layer 23 having a planarized surface obtained by collectively polishing the first plane side of the wafer 30 is made to have an arc cross section which is highest at the position corresponding to the ridge portion and is gradually thinned toward the multilayer semiconductor layers 3 adjacent to the partitioning grooves 12 via the separation grooves 13. Namely, the first plane side of the wafer 30 is polished. This polishing is performed for about 5 minutes using, for example, alumina ($Al_2O_3$) or the like as abrasive. With this polishing, a thickness of the second plated layer 23 above the ridge 14 is set to about 3 to 5 µm. With this long time polishing, the edge of the second plated layer 23 is gradually made gentle and round. The edge of the second plated layer approximately at a right angle as shown in FIG. 5C, is made gentle and round. Namely, with the long time polishing, the second plated layer 23 has an arc cross section that a central region of the second plated layer 23 at the position corresponding to the ridge 14 is thickest and that the second plated layer 23 is gradually thinned toward the partitioning grooves 12.

Figure 6A:
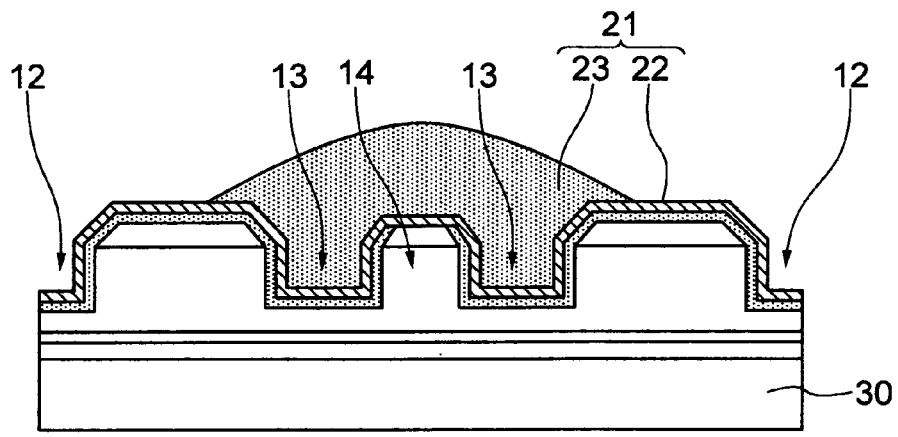
FIGS. 6A to 6C are schematic cross sectional views of the wafer illustrating a process of forming the second plated film in an arc cross section, a photoresist film forming process for determining a pattern of the second plated film, and a process of selectively etching the second plated film to form the second plated film in a predetermined pattern, respectively of the manufacture method for the semiconductor laser diode of the first embodiment.
Figure 6B:
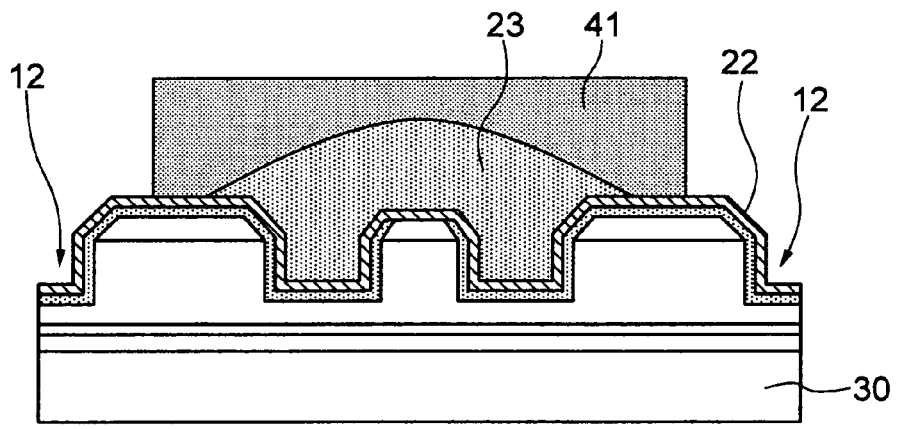
Figure 6C:
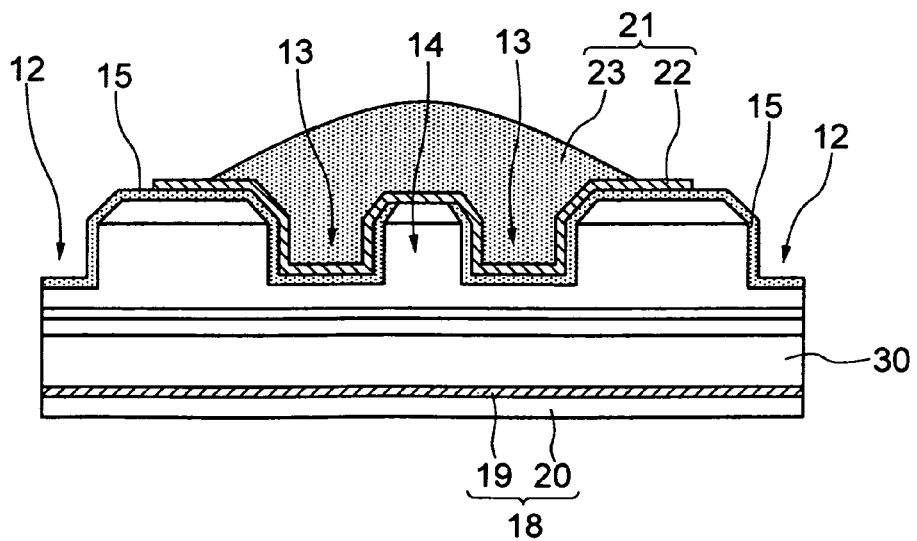

Next, the pattern of the second electrode layer 22 is determined. In order to determine the pattern of the second electrode layer 22, the second electrode layer 22 is etched. Prior to etching, an etching mask 41 is formed by selectively forming a photoresist film as shown in FIG. 6B. The etching mask 41 has a stripe-shaped pattern covering the entirety of the second plated layer 23, and both side edges of the etching mask 41 are positioned on the field regions, protruding by about 1 to 3 µm from both side edges of the second plated layer 23. Thereafter, the second electrode layer 22 is etched. Etching is performed by dry etching or wet etching. After etching, the etching mask 41 is removed. With this etching, as shown in FIG. 6C, the second electrode layer 22 is formed having a pattern slightly protruding from both side edges of the second plated layer 23 to complete formation of a second electrode 21. The edges of the second electrode layer may be extended over or not over the edges of the partitioning grooves 12.

Next, the second plane of the wafer 30 is polished to set a thickness of the wafer 30 slightly thinner than 100 μm. Thereafter, a first electrode layer 19 made of Ti/Pt/Au having a thickness of about 0.3 to 0.5 μm is formed on the second plane of the wafer 30. Thereafter, a first plated layer 20 made of Au having a thickness of 3 to 5 μm is stacked upon the first electrode layer 19. As shown in FIG. 6C, a first electrode (n-electrode) 18 is formed being constituted of the first electrode layer 19 and first plated layer 20.

Next, the wafer 30 is cleaved at a predetermined pitch along a direction (X direction) crossing at a right angle the extension direction (Y direction) of the ridge 14 to form a plurality of stripe bodies 42. With this cleavage, the wafer 30 forms semiconductor substrates 2. FIG. 7A is a schematic perspective view of the stripe body 42. For the purposes of description convenience, FIG. 7A shows four semiconductor laser diodes 1. Namely, a single semiconductor laser diode 1 is formed between two one-dot chain lines. In FIGS. 7A and 7B, the partitioning grooves 12 and the like are shown omitted, and the second electrode 21 is shown as an arc shape body characteristic to the second plated layer 23. Opposite facets (facets along the X direction) of the stripe body 42 are crystal cleaved planes. A crystal plane including the active layer and appearing at the cleaved plane is a facet of the resonator. The resonator is formed by a region including the active layer 5 corresponding to the center line of the second electrode 21.

Next, the stripe body 42 is divided at and along predetermined partitioning grooves so as to leave a plurality of partitioning grooves 12 to manufacture a plurality of semiconductor laser diodes 1 as shown in FIG. 7B. Division is performed by using a center line of the partitioning groove as a target. Therefore, four semiconductor laser diode portions are obtained as shown in FIG. 7B, and a plurality of semiconductor diodes 1 each emitting four laser beams are manufactured.

This semiconductor laser diode 1 is assembled in a package (sealed container) and used as an opto-semiconductor device (semiconductor laser device). An example of an opto-semiconductor device 45 assembling the semiconductor laser diode 1 is shown in FIGS. 10 to 12. FIG. 10 is a partially broken perspective view of an opto-semiconductor device, FIG. 11 is an enlarged perspective view showing a portion of FIG. 10, and FIG. 12 is an enlarged perspective view sowing a portion of FIG. 11.

The opto-semiconductor device 45 has a stem 46 of several mm thick made of a metal plate (disc) having a first plane and a second plane opposite to the first plane, and a cap 47 fixed covering the first plane (upper plane in FIG. 10) of the stem 46. A package 48 is constituted of the stem 46 and cap 47.

The lower portion of the cap 47 is provided with a flange 49, and the bottom plane of the flange 49 is connected to the stem 46. A hole 51 is formed through a ceiling portion 50 of the cap 47, and this hole 51 is sealed with a transparent glass plate 52 to form a window 53. A laser beam is irradiated to an external of the package 48 via the window 53. The ceiling portion 50 faces the first plane of the stem 46.

A heat sink 54 made of copper is fixed to the first plane of the stem 46 at a position displaced from the center of the first plane, with solder or the like. As shown in FIG. 11, a supporting base plate (submount) 55 made of aluminum nitride (AlN) and having good thermal conductivity is fixed to an upper area of a side wall of the heat sink 54 facing the center of the stem 46. Reference symbols of minor components to be described hereinafter are shown in FIG. 11, and some reference symbols of minor components are omitted in FIG. 10.

As shown in FIG. 11, the submount 55 is made of a rectangular plate larger than the semiconductor laser diode 1. The semiconductor laser diode 1 is fixed to the side wall of the heat sink 54 with bonding material (not shown) so as to emit laser beams from upper and lower facets. Namely, a front emission plane as an upper facet of the semiconductor laser diode 1 faces the window 53. Therefore, laser beams emitted from the front emission planes transmit through the window 53.

Since the semiconductor laser diode 1 is a micro piece, it is general that the semiconductor laser diode 1 is fixed once to the submount 55 and then fixed to the heat sink 54. As shown in FIG. 12, the submount 55 has a structure that its width and length are greater than those of the semiconductor laser diode 1. For example, the plate material of the submount has a thickness of 200 μm, a length of 2000 μm and a width of 2000 μm. Wirings 62 having electrode pads 56 are formed on the first plane of the submount 55, the electrode pads 56 corresponding to the second electrodes 21 of the semiconductor laser diode 1. Since the semiconductor laser diode 1 has four second electrodes, the submount 55 is provided with four electrode pads 56. The wirings 62 extend outside the fixing area of the semiconductor laser diode, and their ends constitute wire bonding pads 57 having a wide width in order to connect conductive wires 58. In this embodiment, although not specifically limited, two wire bonding pads 57 are formed on both sides of the submount 55. One ends of the wires 58 are connected to the wire bonding pads 57. The first electrode 18 disposed on the second plane of the semiconductor laser diode 1 is exposed as shown in FIG. 12, and one end of a wire 58 is connected to the first electrode 18.

A metallized layer 59 is formed on the second plane opposite to the first plane of the submount 55 in order to fix the submount 55 to the heat sink 54.

In the semiconductor laser diode 1 shown in FIG. 12, the first electrode 18 has a pattern not allowing the first electrode to be cleaved and divided when the semiconductor wafer (semiconductor substrate) is cleaved and divided to form semiconductor laser diodes 1.

Figure 15A:
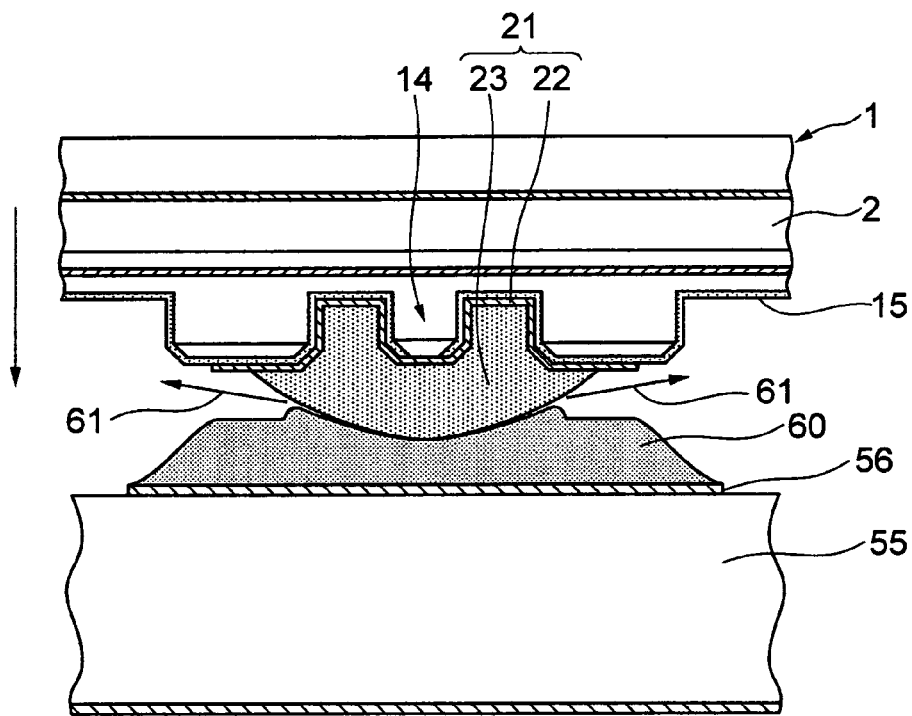
FIGS. 15A and 15B are schematic enlarged cross sectional partial views illustrating a sequence of mounting the semiconductor laser diode on the submount.
Figure 15B:
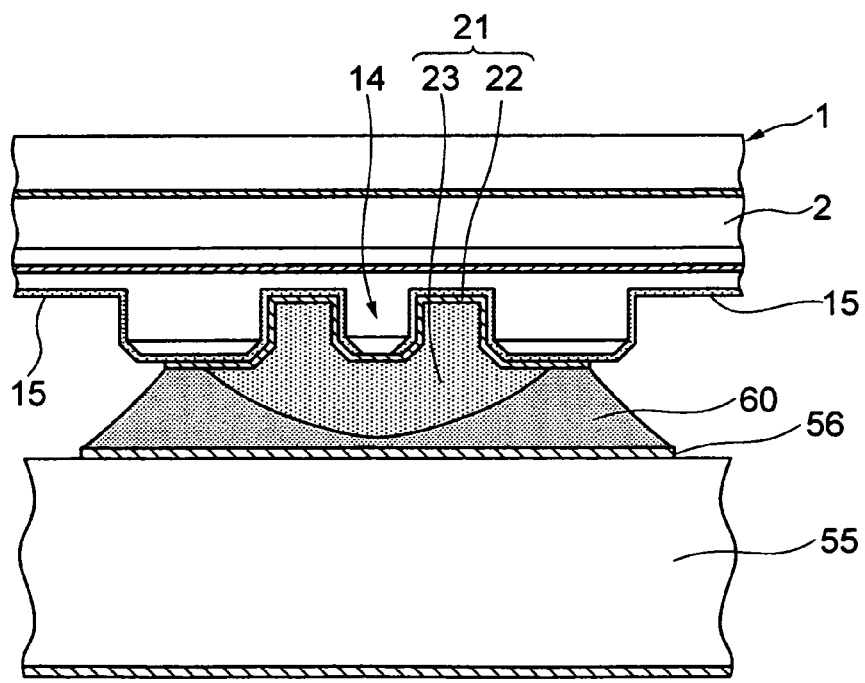

As shown in FIG. 15B, the second electrode 21 of the semiconductor laser diode 1 is fixed to an electrode pad 56 by a bonding material 60. For example, the bonding material 60 is solder such as AuSn.

As shown in FIGS. 10 and 11, the submount 55 with the semiconductor laser diode 1 mounted thereon is stacked upon, and fixed to the side wall of the heat sink 54 positioned on the center side of the stem 46, by a bonding material (not shown). The semiconductor laser diode 1 is fixed to the submount 55 in such a manner that the front emission plane of the semiconductor laser diode 1 is positioned at a level of the top plane of the submount 55. The submount 55 is fixed to the heat sink 54 in such a manner that the front emission plane of the semiconductor laser diode 1 is positioned at a level of the upper wall of the heat sink 54. When fixing, the area (resonance facet) of the semiconductor laser diode 1 for emitting laser beams is positioned at the center of the stem 46.

As shown in FIGS. 10 and 11, six leads 63a to 63f made of metal are fixed to the stem 46. Five leads 63b to 63f are fixed to the stem 46 in a through state via an insulating member 64. The remaining lead 63a is fixed to the second plane opposite to the first plane of the stem 46 in an abutting state, and takes an electrically equipotential state to the stem 46.

As shown in FIGS. 11 and 12, the first electrode 18 of the semiconductor laser diode 1 and the heat sink 54 is connected by a wire 58. The first electrode 18 is therefore electrically connected to the lead 63a. As shown in FIGS. 11 and 12, each wire bonding pad 57 and leads 63b, 63c, 634 and 63f are electrically connected by wires 58. The second electrode 21 of each semiconductor laser diode portion of the semiconductor laser diode 1 is electrically connected to each of the leads 63b, 63c, 63e and 63f. As a predetermined voltage is applied across the lead 63a and each of the leads 63b, 63c, 63e and 63f, a laser beam is emitted from each resonator facet of each semiconductor laser diode portion.

A photoreceptor 65 is fixed to the first plane of the stem 46 to receive laser beams emitted from the back emission planes of the semiconductor laser diode 1. A transparent upper electrode 66 of the photoreceptor 65 and the lead 63d are electrically connected by a wire 58.

As described above, the heat sink 54, leads 63a to 63f, submount 55, semiconductor laser diode 1 and wires 58 respectively on the first plane side of the stem 46 are covered with the cap 47.

As a predetermined voltage is applied across the lead 63a and a predetermined one of the leads 63b, 63c, 63e and 63f of the opto-semiconductor device 45, a laser beam is emitted from a predetermined semiconductor laser diode portion of the semiconductor laser diode 1. This laser beam transmits through the window 53 and is irradiated to the external of the package 48.

Further, as a predetermined voltage is applied across the lead 63a and the leads 63b, 63c, 63e and 63f, laser beams are emitted from all laser diode portions (four semiconductor laser diode portions) of the semiconductor laser diode 1.

Next, with reference to FIGS. 13A to 16, description will be made on a manufacture method for the opto-semiconductor device 45.

Figure 13A:
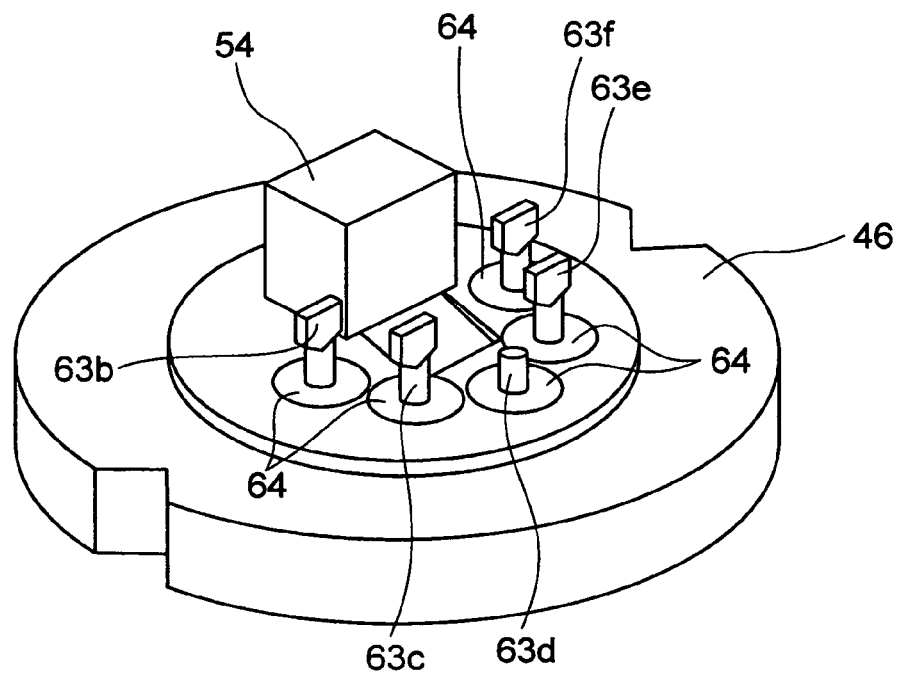
FIGS. 13A and 13B are perspective views showing a portion of a stem in a process of preparing the stem and a process of mounting a photoreceptor and a semiconductor laser diode, respectively of the manufacture method of the semiconductor laser diode of the first embodiment.

First, as shown in FIG. 13A, prepared is the stem 46 having the leads 63a to 63f and heat sink 54 mounted thereon. The first plane of the stem 46 has a higher stepped portion in which the cap 47 is fitted. A photoreceptor fixing surface to which the photoreceptor 65 is fixed is slightly inclined so that a laser beam reflected at a photoreceptor surface will not return to the back emission plane of the semiconductor laser diode 1. In FIG. 13A, lead portions extending to a bottom of the stem 46 are omitted.

Figure 13B:
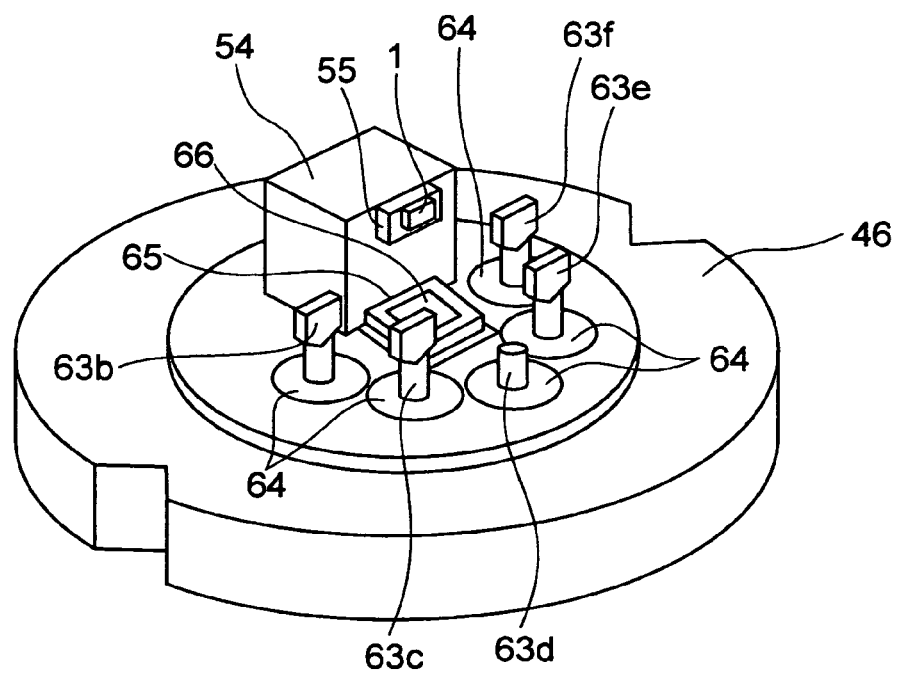

Next, as shown in FIG. 13B, the photoreceptor 65 is fixed to the photoreceptor fixing surface, with the upper electrode 66 being directed upward. The submount 55 with the semiconductor laser diode 1 mounted thereon is fixed to the side wall of the heat sink 54 on the center side of the stem 46, with a bonding material (not shown).

With reference to FIGS. 14A and 14b and FIGS. 15A and 15B, description will be made on a method of mounting the semiconductor laser diode 1 on the submount 55 via the bonding material 60. The bonding material 60 is solder such as AuSn for example.

Figure 14A:
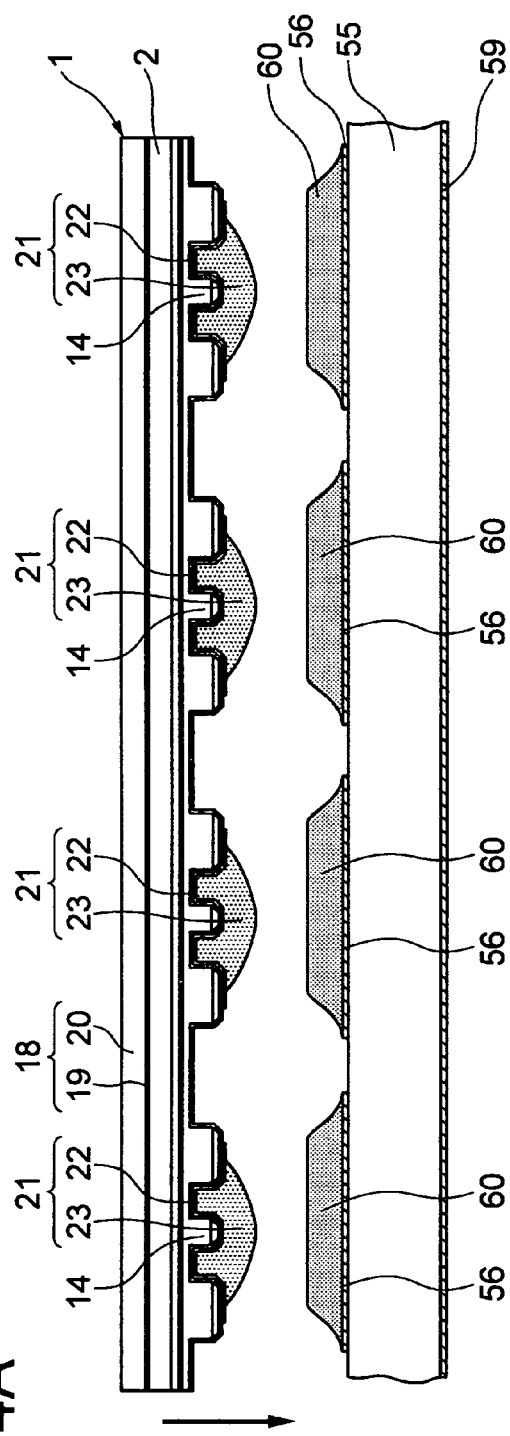
FIGS. 14A and 14B are enlarged cross sectional views illustrating a method of mounting a semiconductor laser diode on a submount in the manufacture method for the opto-semiconductor device.
Figure 14B:
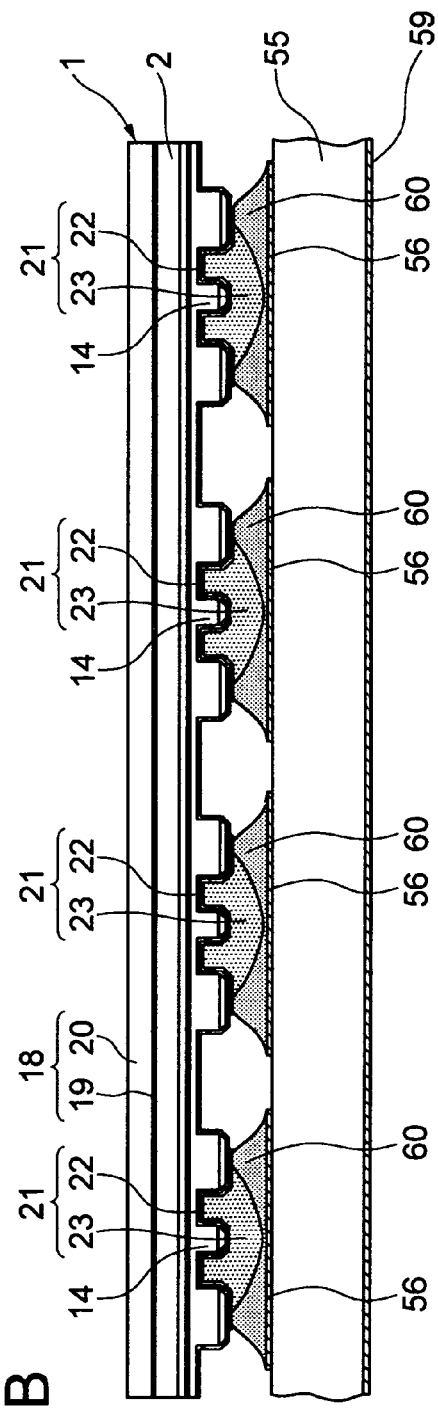

In order to mount the semiconductor laser diode 1 on the submount 55, as shown in FIG. 14A, prepared is the submount 55 with each electrode pad 56 coated with the bonding material 60 to a predetermined thickness (e.g., 3 to 5 μm). Thereafter, as shown in FIG. 14A, the semiconductor laser diode 1 in a state that the second electrode 21 faces downward is aligned in position with the submount 55, and lowered. Although not shown, the submount 55 with the first plane facing upward is placed on a work table, and the semiconductor laser diode 1 is held by a vacuum suction tool (not shown). By gradually lowering the vacuum suction tool, the second electrode 21 having an arc cross section, more strictly, the most protruding central region of the second plated layer 23, contacts first the bonding material 60. As the semiconductor laser diode 1 is further lowered, as shown in FIG. 15A, air between the bonding material 60 and the second electrode 21 (second plated layer 23) thrust into the bonding material 60 is forcibly pushed into the atmospheric air as indicated by arrows 61. Therefore, in a state that the semiconductor laser diode 1 is lowered to a predetermined height, air bubbles (voids) do not exist between the second electrode 21 (second plated layer 23) and bonding material 60 as shown in FIG. 15B. Therefore, as the bonding material 60 is subjected to a heating process at a predetermined temperature (e.g., 300° C.) for a predetermined time (e.g., 10 seconds), as shown in FIG. 14B the semiconductor laser diode 1 can be fixed to the submount 55. The bonding material 60 and the second electrodes of four semiconductor laser diode portions of the semiconductor laser diode 1 can therefore be bonded without any air bubbles (voids).

Figure 16:
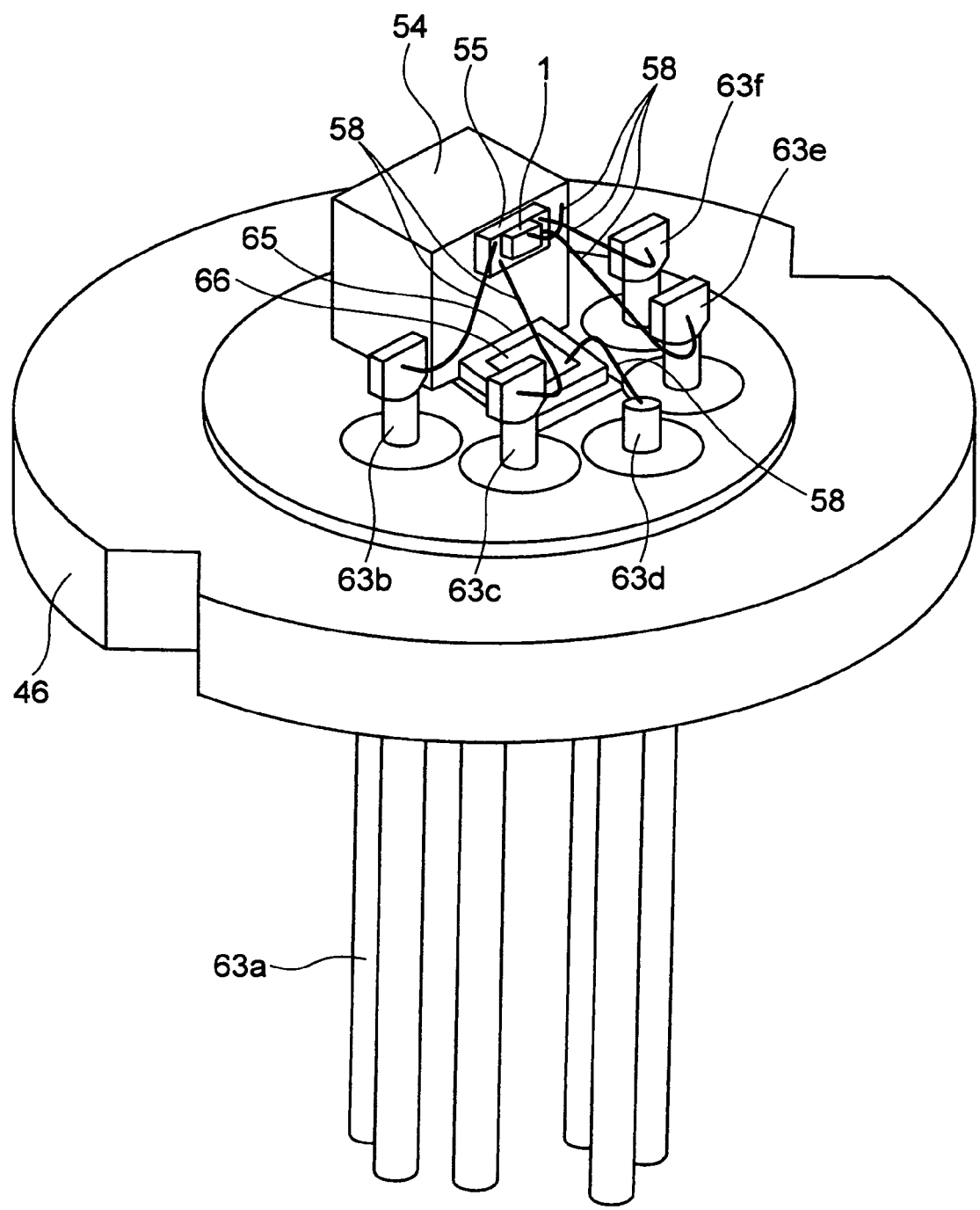
FIG. 16 is a perspective view showing the state of the stem after wire bonding in the manufacture method for the opto-semiconductor device.

Next, wire bonding is performed to electrically connect the electrodes of the semiconductor laser diode 1 and photoreceptor 65 and the predetermined leads 63a to 63f. FIG. 16 is a perspective view of the stem 46 in a completion state of wire bonding. Connection relations of the wires 58 have already described with reference to FIGS. 11 and 12, and the duplicated description is omitted.

Next, the cap 47 having the window 53 already described is prepared, and thereafter the flange 49 of the cap 47 is fixed to the stem 46 with a bonding material so that the opto-semiconductor 45 shown in FIG. 10 can be manufactured.

The first embodiment has the following advantages.

(1) The opto-semiconductor device 45 has a structure that the semiconductor laser diode 1 having a plurality of semiconductor laser diode portions, disposed in parallel, for emitting laser beams is stacked upon and bonded to the submount 55 via the soft bonding material 60 (solder such as AuSn). The semiconductor laser diode 1 has the first electrode 18 as the common electrode on the first plane side of the semiconductor substrate, and the second electrodes 21 inherent to the semiconductor laser diode portions on the second plane side. The electrode pads 56 are disposed on the first plane side of the submount 55 in correspondence with the second electrodes 21 inherent to the semiconductor laser diode portions. Each second electrode 21 is constituted of the lower second electrode layer 22 and the upper second plated layer 23. The second plated layer 23 has the arc cross section that the region corresponding to the ridge 14 portion of each semiconductor laser diode portion is thickest, and the second plated layer 23 is gradually thinned toward the partitioning grooves via the separation groove 13. Before the second electrode 21 is stacked upon and fixed to the electrode pad 56 of the submount 55, the soft bonding material 60 of solder (solder such as AuSn) is disposed on the electrode pad 56, and thereafter the semiconductor laser diode 1 in a state that the second electrode 21 faces downward is aligned in position and then lowered to make each second electrode 21 be stacked upon being thrust into the bonding material 60 on each electrode pad 56. The surface regions of the second plated layer 23 on both sides of the center line gradually contact the bonding material 60, being thrust into the bonding material.

Air existing between the electrode pad 56 and second plated layer 23 is pushed out to both sides of the strip-shaped bonding region by the function of the arc cross section of the second plated layer 23. Air bubbles (voids) are not formed therefore at an interface between the bonding material 60 and the second plated layer 23 (second electrode 21). If the surface of the second plated layer is a flat surface, there may be generated an area where the flat surface bonding material does not become wet. However, there occurs no phenomenon that the bonding material 60 does not become wet because of the second plated layer 23 having the arc cross section.

Accordingly, a distribution of stress applied to the ridge portion to be caused by voids and wettability defects of the bonding material can be made uniform, an irregular stress will not be applied to the resonator (optical waveguide), and rotation of a polarization angle of a laser beam can be reduced.

In the semiconductor laser diode 1 of this embodiment, air bubbles (voids) are not contained in the bonding region between the submount 55 and the second electrode 21 of each of all (four) semiconductor laser diode portions. Therefore, a stress balance at each bonding region becomes constant, it is hard to form a variation in polarization directions of laser beams, and polarization directions are made constant.

As a result, the opto-semiconductor device 45 as a multi-beam laser of the embodiment can have desired characteristics even if optical components for guiding a laser beam have polarization angle dependency. The opto-semiconductor device 45 of the multibeam structure is therefore optimum for a light source of a plane paper copier (PPC) and a laser printer.

Second Embodiment

Figure 17:
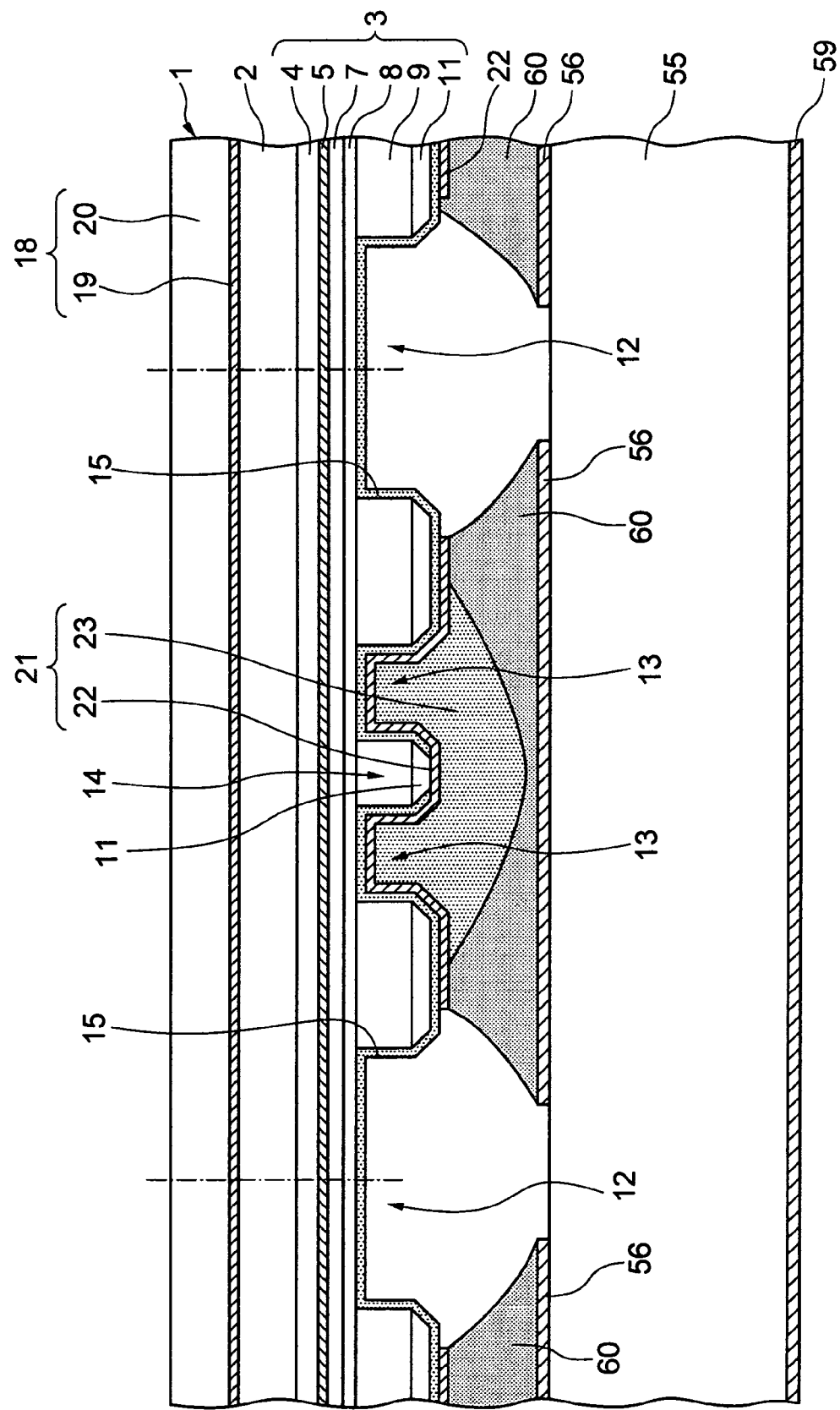
FIG. 17 is an enlarged view partially showing a semiconductor laser diode mounted on a submount of an opto-semiconductor device according to a second embodiment of the present invention.
Figure 18:
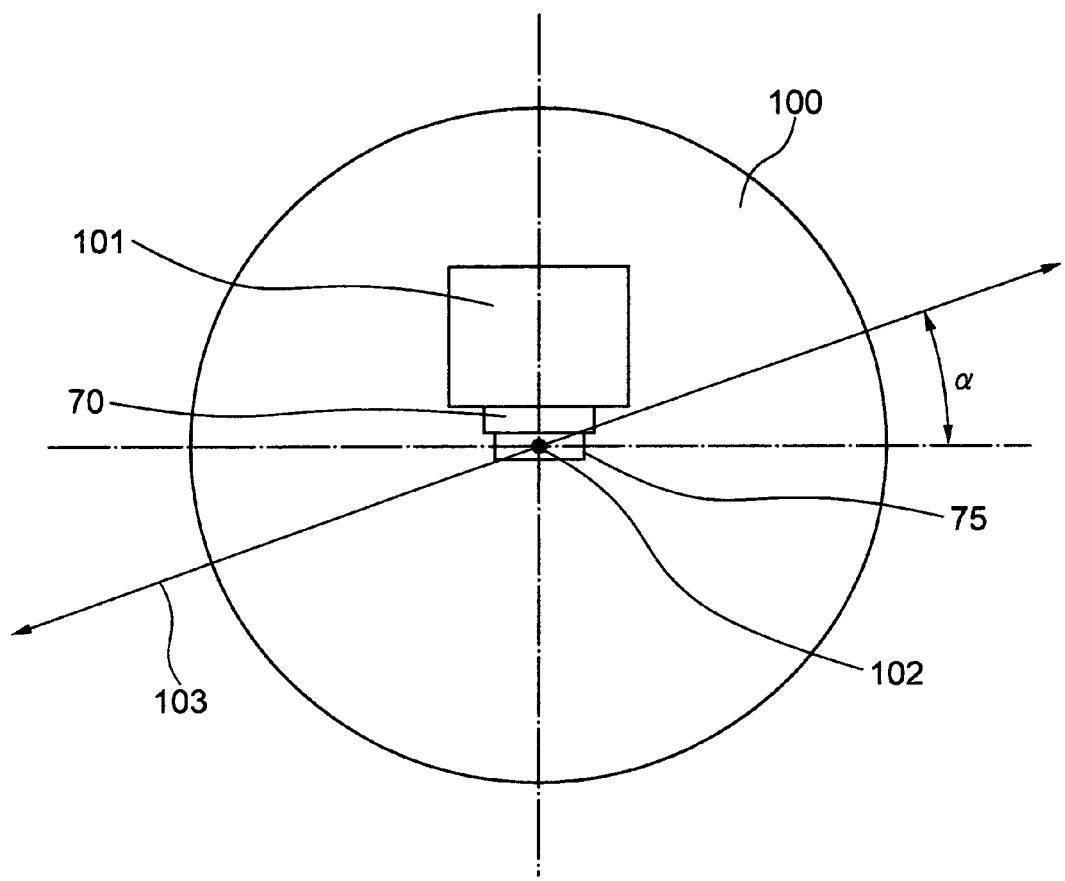
FIG. 18 is a schematic diagram explaining a polarization angle.
Figure 19A:
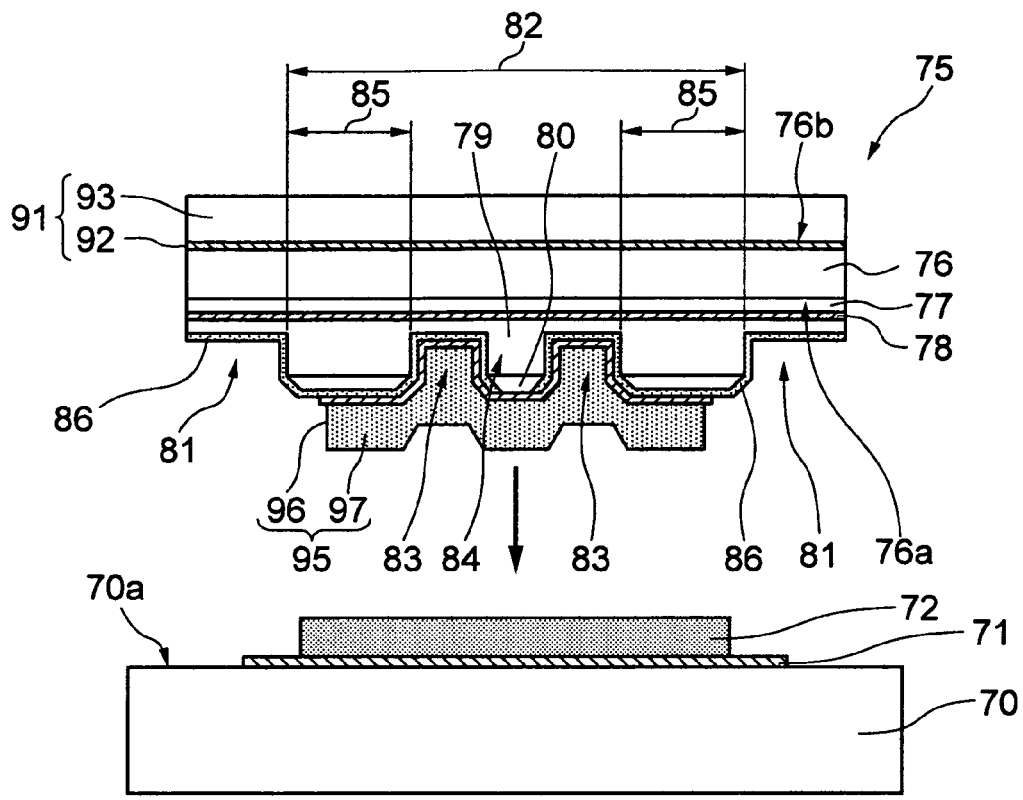
FIGS. 19A and 19B are schematic diagrams showing a mount structure for mounting a semiconductor laser diode of a ridge structure on a submount, studied prior to the present invention.
Figure 19B:
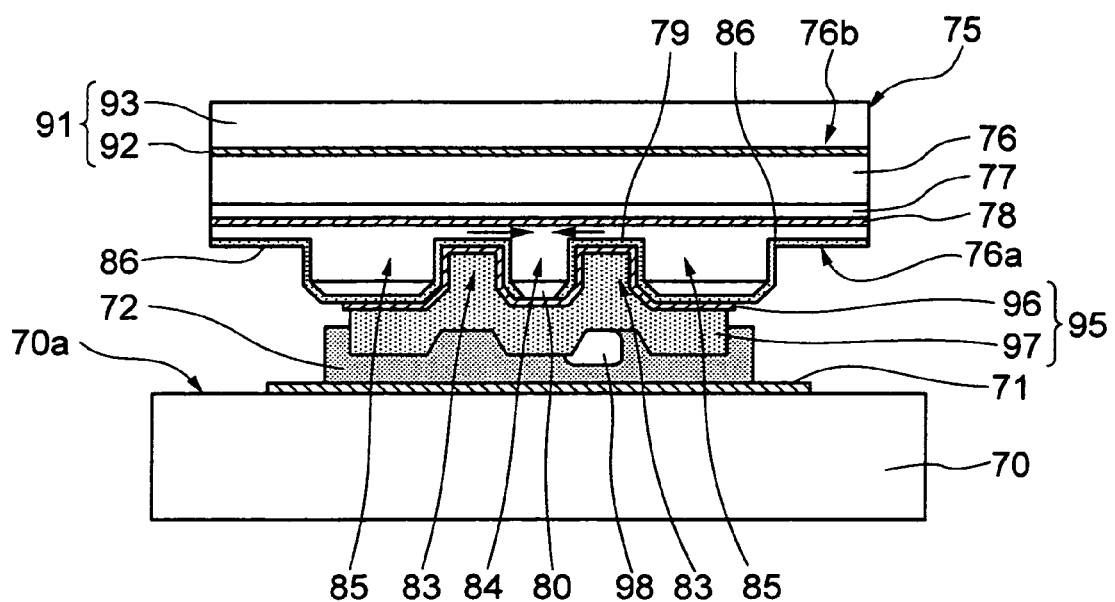

FIG. 17 is an enlarged view of a semiconductor laser diode mounted on a submount in an opto-semiconductor device according to the second embodiment of the present invention, and corresponds to FIG. 14B of the first embodiment.

In the second embodiment, only the cross sectional structure of a semiconductor laser diode 1 is different from that of the first embodiment. Namely, the second conductivity type clad layer 6 of the second conductivity type (p type) of the first embodiment is replaced with a first second conductivity type clad layer 7, an etching stopper layer 8 of the second conductivity type stacked upon the first second conductivity type clad layer 7, and a second second conductivity type clad layer 9 of the second conductivity type stacked upon the etching stopper layer 8. The etching stopper layer 8 is made of material having a slower etching rate than that of the second second conductivity type clad layer 9. Namely, the first second conductivity type clad layer 7 and second second conductivity type clad layer 9 are made of an AlGaInP layer, and the etching stopper layer 8 is made of a GaInP layer.

Therefore, as partitioning grooves 12 and separation grooves 13 are formed by the manufacture method for the semiconductor laser diode 1, the etching stopper layer 8 can be exposed on the bottoms of the partitioning grooves 12 and separation grooves 13. As a result, a ridge 14 is made of the second second conductivity type clad layer 9 and contact layer 11.

Although not shown, in manufacturing the semiconductor laser diode 1, an n-type clad layer 4, an active layer 5, the first second conductivity type clad layer 7, etching stopper layer 8, second second conductivity type clad layer 9 and contact layer 11 are sequentially formed to form a multilayer semiconductor layer 3 on a first plane of a semiconductor substrate 2. By using a groove forming etching mask constituted of a ridge forming etching mask 31 and a field etching mask 32 as an etching mask, the contact layer 11 and second second conductivity type clad layer 9 are etched to form the partitioning grooves 12 and separation grooves 13. The bottoms of the partitioning grooves 12 and separation grooves 13 are therefore the etching stopper layer 8. By using succeeding processes similar to those described in the first embodiment, the semiconductor laser diode 1 is manufactured. In this manner, the semiconductor laser diode 1 shown in FIG. 17 can be manufactured.

The present invention made by the inventor has been described in connection with the preferred embodiments. The invention is not limited only to the above embodiments. It is obvious that various modifications are possible without departing from the gist of the present invention. In the embodiments, although the present invention is applied to a semiconductor laser diode of a 0.6 µm band, the present invention is also applicable to an opto-semiconductor device assembling another semiconductor laser diode, e.g., a long wavelength semiconductor laser diode (1.3 µm band, 1.5 µm band).

DESCRIPTION OF REFERENCE NUMERALS

1 . . . semiconductor laser diode (semiconductor laser chip), 2 . . . semiconductor substrate, 3 . . . multilayer semiconductor layer, 4 . . . first conductivity type n-type) clad layer, 5 . . . active layer, 6 . . . second conductivity type (p-type) clad layer, 7 . . . first second conductivity type clad layer, 8 . . . etching stopper layer, 9 . . . second second conductivity type clad layer, 11 . . . contact layer, 12 . . . partitioning groove, 13 . . . separation groove, 14 . . . ridge, 15 . . . insulating layer, 18 . . . first electrode (n-electrode), 19 . . . first electrode layer, 20 . . . first plated layer, 21 . . . second electrode, 22 . . . second electrode layer, 23 . . . second plated layer, 30 . . . semiconductor wafer, 31 . . . ridge forming etching mask, 32 . . . field etching mask, 35 . . . mask, 36 . . . plating vessel, 37 . . . electrolytic plating anode plate, 38 . . . plating liquid, 39 . . . electrolytic plating power feeding pin, 40 . . . power source, 41 . . . etching mask, 42 . . . stripe body, 45 . . . opto-semiconductor device, 46 . . . stem, 47 . . . cap, 48 . . . package, 49 . . . flange portion, 50 . . . ceiling portion, 51 . . . hole, 52 . . . glass plate, 53 . . . window, 54 . . . heat sink, 55 . . . supporting base plate (submount), 56 . . . electrode pad, 57 . . . wire bonding pad, 58 . . . wire, 59 . . . metallized layer, 60 . . . bonding material, 61 . . . arrow symbol, 62 . . . wiring, 63a to 63f . . . lead, 64 . . . insulating member, 65 . . . photoreceptor, 66 . . . upper electrode, 70 . . . submount, 70a . . . first plane, 71 . . . electrode pad, 72 . . . bonding material, 75 . . . semiconductor laser diode, 76 . . . semiconductor substrate, 77 . . . first conductivity type clad layer, 78 . . . active layer, 79 . . . second conductivity type clad layer, 80 . . . contact layer, 81 . . . partitioning groove, 82 . . . partitioning region, 83 . . . separation groove, 84 . . . ridge, 85 . . . field region, 86 . . . insulating layer, 91 . . . first electrode, 92 . . . first electrode layer, 93 . . . first plated layer, 95 . . . second electrode, 96 . . . second electrode layer, 97 . . . second plated layer, 98 . . . air bubble (void), 100 . . . stem, 101 . . . heat sink, 102 . . . laser beam, 103 . . . polarization plane It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor laser diode comprising:
a semiconductor substrate of a first conductivity type;
a multilayer semiconductor layer constituted of a first conductivity type clad layer of the first conductivity type, an active layer, a second conductivity type clad layer of a second conductivity type, and a contact layer of the second conductivity type sequentially stacked on a first plane of said semiconductor substrate;
a plurality of partitioning grooves formed in said multilayer semiconductor layer, extending from one end to the other end of said semiconductor substrate, and formed from a surface of said contact layer to a predetermined depth of said second conductivity type clad layer;
a stripe-shaped ridge formed in each partitioning region sandwiched between adjacent ones of said partitioning grooves, and sandwiched between two separation grooves extending from the one end to the other end of said semiconductor substrate and formed from the surface of said contact layer to the predetermined depth of said second conductivity type clad layer;

an insulating layer covering an area from each side wall of said contact layer of each of said ridges to an edge of said partitioning grooves via said separation groove;

a first electrode formed on a second plane opposite to the first plane of said semiconductor substrate; and a second electrode formed in each of said partitioning regions, covering an area above said ridge, above said separation grooves on both sides of said ridge and above said multilayer semiconductor layers outside said separation grooves, wherein:

said second electrode is constituted of a lower second electrode layer and a second plated layer formed stacked upon said second electrode layer; and said second plated layer has an arc cross section that a region corresponding a portion of said ridge is thickest and the second plated layer becomes gradually thin toward said partitioning grooves.

2. The semiconductor laser diode according to claim 1, wherein:

said second conductivity type clad layer of the second conductivity type comprises a first second conductivity type clad layer, an etching stopper layer stacked upon said first second conductivity type clad layer, and a second second conductivity type clad layer stacked upon said etching stopper layer;

said etching stopper layer is made of material having a slower etching rate than an etching rate of said second second conductivity type clad layer;

bottoms of said partitioning grooves and said separation grooves are formed by said etching stopper layer; and said ridge is formed by said second second conductivity type clad layer and said contact layer.

3. The semiconductor laser diode according to claim 1, wherein said active layer has a multiple quantum well structure.

4. The semiconductor laser diode according to claim 1, wherein said second electrode layer is a layer of a Ti layer, a Pt layer and an Au layer sequentially stacked, and said second plated layer is made of an Au layer.

5. The semiconductor laser diode according to claim 1, wherein said partitioning grooves are two partitioning grooves.

6. A manufacture method for a semiconductor laser diode comprising steps of:

(a) preparing a semiconductor substrate of a first conductivity type;

(b) forming a multilayer semiconductor layer by continuously and epitaxially growing a first conductivity type clad layer of the first conductivity type, an active layer, a second conductivity type clad layer of a second conductivity type, and a contact layer of the second conductivity type sequentially stacked on a first plane of said semiconductor substrate;

(c) forming a plurality of groove forming masks in parallel on said multilayer semiconductor layer by forming a cover film on the side of the first plane of said semiconductor substrate and selectively etching said cover film, said groove forming mask including a ridge forming etching mask for forming a stripe-shaped ridge and a field etching mask for forming a field on both sides of said ridge forming etching mask at positions spaced by a predetermined distance from said ridge forming etching mask;

(d) by using said groove forming masks as a mask, etching from a surface of said contact layer to a predetermined depth of said first conductivity type clad layer to form a partitioning groove on both sides of said groove forming mask, and in each partitioning region sandwiched between adjacent ones of said partitioning grooves, to form a separation groove between said ridge forming etching mask and said field etching mask, to thereby form a stripe-shaped ridge under said ridge forming etching mask;

(e) by forming an insulating layer on the side of said first plane of said semiconductor substrate and selectively etching the insulating film, forming an insulating layer covering an area from each side wall of said contact layer of each of said ridges to an edge of said partitioning groove via said separation groove;

(f) forming a second electrode in each of said partitioning regions, covering an area above said ridge, above said separation grooves on both sides of said ridge and above said multilayer semiconductor layers outside said separation grooves;

(g) forming a first electrode on a second plane opposite to the first plane of said semiconductor substrate;

(h) cleaving said semiconductor substrate at a predetermined pitch along a direction perpendicular to a longitudinal direction of said ridge to form a plurality of stripe bodies; and (i) dividing said stripe body at and along portions of predetermined ones of said partitioning grooves to leave a plurality of said partitioning grooves, wherein said step (f) comprises steps of:

(j) forming a second electrode layer on a whole area of the first plane of said semiconductor substrate;

(k) by forming a photoresist film on the side of the first plane of said semiconductor substrate and electively etching the photoresist film, forming a photoresist film, in said partitioning region including said ridge, said separation groove on both sides of said ridge and said multilayer semiconductor layers adjacent to said separation grooves, having openings each opening an area from a predetermined position of one of said multilayer semiconductor layers to a predetermined position of the other of said multilayer semiconductor layers;

(l) forming a second plated layer by a plating process on said second electrode layer exposed in each of said openings;

(m) collectively polishing said photoresist film and said plated layer on the side of the first plane of said semiconductor substrate to planarize surfaces of said photoresist film and said plated layer, and thereafter removing said photoresist film; and (n) making said second plated layer having a planarized surface through collective polishing on the side of the first plane of said semiconductor substrate have an arc cross section a region corresponding a portion of said ridge is thickest and the second plated layer becomes gradually thin toward said partitioning grooves over said separation grooves, and said second electrode is constituted of said second electrode layer and said second plated layer stacked upon said second electrode layer.

7. The manufacture method for a semiconductor laser diode according to claim 6, further comprising after said step (n) a step (o) of removing said first electrode layer at least on each of said partitioning grooves.

8. The manufacture method for a semiconductor laser diode according to claim 6, in said step (b), a first conductivity type clad layer of the first conductivity type, an active layer, a first second conductivity type clad layer of the second conductivity type, an etching stopper layer of the second conductivity type, a second second conductivity clad layer of the second conductivity type, and a contact layer of the second conductivity type, are sequentially stacked on the first plane of said semiconductor substrate, and said etching stopper layer is made of material having an etching rate slower than an etching rate of said second second conductivity type clad layer.

9. The manufacture method for a semiconductor laser diode according to claim 6, in said step (b), said active layer is formed to have a multiple quantum well structure.

10. The manufacture method for a semiconductor laser diode according to claim 6, in said step (i) said second electrode layer is formed by sequentially stacking a Ti layer, a Pt layer and an Au layer, and in said step (k) an Au layer is formed by a plating process on said second electrode layer exposed in each of said openings.

11. A manufacture method for an opto-semiconductor device comprising steps of:

preparing a semiconductor laser diode comprising:

a semiconductor substrate of a first conductivity type;

a multilayer semiconductor layer constituted of a first conductivity type clad layer of the first conductivity type, an active layer, a second conductivity type clad layer of a second conductivity type, and a contact layer of the second conductivity type sequentially stacked on a first plane of said semiconductor substrate;

a plurality of partitioning grooves formed in said multilayer semiconductor layer, extending from one end to the other end of said semiconductor substrate, and formed from a surface of said contact layer to a predetermined depth of said second conductivity type clad layer;

a stripe-shaped ridge formed in each partitioning region sandwiched between adjacent ones of said partitioning grooves, and sandwiched between two separation grooves extending from the one end to the other end of said semiconductor substrate and formed from the surface of said contact layer to the predetermined depth of said second conductivity type clad layer;

an insulating layer covering an area from each side wall of said contact layer of each of said ridges to an edge of said partitioning groove via said separation groove;

a resonator formed in a potion of said active region corresponding to said ridge;

a first electrode formed on a second plane opposite to the first plane of said semiconductor substrate and supplying an electric power to each of said resonators; and a second electrode formed in each of said partitioning regions, covering an area above said ridge, above said separation grooves on both sides of said ridge and above said multilayer semiconductor layers outside said separation grooves, wherein:

said second electrode is constituted of a lower second electrode layer and a second plated layer formed stacked upon said second electrode layer; and said second plated layer has an arc cross section that a region corresponding a portion of said ridge is thickest and the second plated layer becomes gradually thin toward said partitioning grooves;

preparing a supporting base plate on which said semiconductor laser diode is stacked and mounted at a first plane of said supporting base plate, said first plane having wirings including electrode pads corresponding to said second electrodes; and forming a soft conductive bonding material on said electrode pads of said base plate, thereafter abutting, pushing and bonding each of said second electrodes of said semiconductor laser diode to a corresponding one of said electrode pads, subjecting said bonding material to a hardening process to thereby mount said semiconductor laser diode on said supporting base plate.

12. The manufacture method for an opto-semiconductor device according to claim 11, wherein:

said second conductivity type clad layer of the second conductivity type comprises a first second conductivity type clad layer, an etching stopper layer stacked upon said first second conductivity type clad layer, and a second second conductivity type clad layer stacked upon said etching stopper layer;

said etching stopper layer is made of material having a slower etching rate than an etching rate of said second second conductivity type clad layer;

bottoms of said partitioning grooves and said separation grooves are formed by said etching stopper layer; and said ridge is formed by said second second conductivity type clad layer and said contact layer.

13. The manufacture method for an opto-semiconductor device according to claim 11, wherein said active layer has a multiple quantum well structure.

14. The manufacture method for an opto-semiconductor device according to claim 11, wherein said second electrode layer is a layer of a Ti layer, a Pt layer and an Au layer sequentially stacked, and said second plated layer is made of an Au layer.

* * * * *